(12) United States Patent
Chen et al.

(10) Patent No.: US 12,347,802 B2
(45) Date of Patent: Jul. 1, 2025

(54) DIE CORNER REMOVAL FOR UNDERFILL CRACK SUPPRESSION IN SEMICONDUCTOR DIE PACKAGING

(71) Applicant: Taiwan Semiconductor Manufacturing Company Limited, Hsinchu (TW)

(72) Inventors: Wei-Yu Chen, Hsinchu (TW); Chi-Yang Yu, Zhongli (TW); Kuan-Lin Ho, Hsinchu (TW); Chin-Liang Chen, Kaohsiung (TW); Yu-Min Liang, Zhongli (TW); Jiun Yi Wu, Zhongli (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/446,554

(22) Filed: Aug. 9, 2023

(65) Prior Publication Data
US 2023/0387061 A1    Nov. 30, 2023

Related U.S. Application Data

(62) Division of application No. 17/205,669, filed on Mar. 18, 2021, now Pat. No. 11,824,032.

(51) Int. Cl.
*H01L 23/00* (2006.01)
*H01L 21/56* (2006.01)
(Continued)

(52) U.S. Cl.
CPC .......... *H01L 24/20* (2013.01); *H01L 21/561* (2013.01); *H01L 21/563* (2013.01);
(Continued)

(58) Field of Classification Search
None
See application file for complete search history.

(56) References Cited

U.S. PATENT DOCUMENTS

10,763,404 B2 * 9/2020 Chen ............... H01L 33/507
2017/0098743 A1 * 4/2017 Chen ............... H01L 33/505
(Continued)

FOREIGN PATENT DOCUMENTS

EP    2230688 A1 *  9/2010  ......... H01L 21/6835

*Primary Examiner* — Telly D Green
(74) *Attorney, Agent, or Firm* — The Marbury Law Group, PLLC

(57) ABSTRACT

A chip package structure includes a fan-out package containing at least one semiconductor die, an epoxy molding compound (EMC) die frame laterally surrounding the at least one semiconductor die, and a redistribution structure. The fan-out package has chamfer regions at which horizontal surfaces and vertical surfaces of the fan-out package are connected via angled surfaces that are not horizontal and not vertical. The chip package structure may include a package substrate that is attached to the fan-out package via an array of solder material portions, and an underfill material portion that laterally surrounds the array of solder material portions and contacts an entirety of the angled surfaces. The angled surfaces eliminate a sharp corner at which mechanical stress may be concentrated, and distribute local mechanical stress in the chamfer regions over a wide region to prevent cracks in the underfill material portion.

20 Claims, 32 Drawing Sheets

(51) Int. Cl.
*H01L 23/31* (2006.01)
*H01L 25/065* (2023.01)

(52) U.S. Cl.
CPC ...... *H01L 23/3185* (2013.01); *H01L 23/3192* (2013.01); *H01L 24/16* (2013.01); *H01L 24/19* (2013.01); *H01L 24/24* (2013.01); *H01L 24/32* (2013.01); *H01L 24/73* (2013.01); *H01L 24/81* (2013.01); *H01L 24/92* (2013.01); *H01L 25/0652* (2013.01); *H01L 25/0655* (2013.01); *H01L 25/0657* (2013.01); *H01L 24/14* (2013.01); *H01L 2224/13* (2013.01); *H01L 2224/13024* (2013.01); *H01L 2224/14131* (2013.01); *H01L 2224/16145* (2013.01); *H01L 2224/16227* (2013.01); *H01L 2224/19* (2013.01); *H01L 2224/2101* (2013.01); *H01L 2224/221* (2013.01); *H01L 2224/24137* (2013.01); *H01L 2224/32225* (2013.01); *H01L 2224/73204* (2013.01); *H01L 2224/73209* (2013.01); *H01L 2224/73217* (2013.01); *H01L 2224/81815* (2013.01); *H01L 2224/92125* (2013.01); *H01L 2225/06513* (2013.01); *H01L 2225/06517* (2013.01); *H01L 2924/1431* (2013.01); *H01L 2924/1437* (2013.01)

(56) References Cited

U.S. PATENT DOCUMENTS

2018/0005991 A1* 1/2018 Seidemann ............. H01L 24/96
2019/0304938 A1* 10/2019 Hadizadeh ............. H01L 24/24

* cited by examiner

DIE CORNER REMOVAL FOR UNDERFILL CRACK SUPPRESSION IN SEMICONDUCTOR DIE PACKAGING

RELATED APPLICATIONS

This application is a divisional application of U.S. application Ser. No. 17/205,669 entitled "Die Corner Removal for Underfill Crack Suppression in Semiconductor Die Package," filed on Mar. 18, 2021, the entire contents of which is incorporated herein by reference for all purposes.

BACKGROUND

Interfaces between a fan-out wafer level package (FOWLP) and an underfill material portion are subjected to mechanical stress during subsequent handling of an assembly of the FOWLP, the underfill material portion, and a packaging substrate, such as attachment of the packaging substrate to a printed circuit board (PCB). In addition, interfaces between a fan-out wafer level package (FOWLP) and an underfill material portion are subjected to mechanical stress during use within a computing device, such as when a mobile device is accidently dropped to cause a mechanical shock during usage. Cracks may be formed in the underfill material, and may induce additional cracks in a semiconductor die, solder material portions, redistribution structures, and/or various dielectric layers within a semiconductor die or within a package substrate. Thus, formation of cracks in the underfill material needs to be suppressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
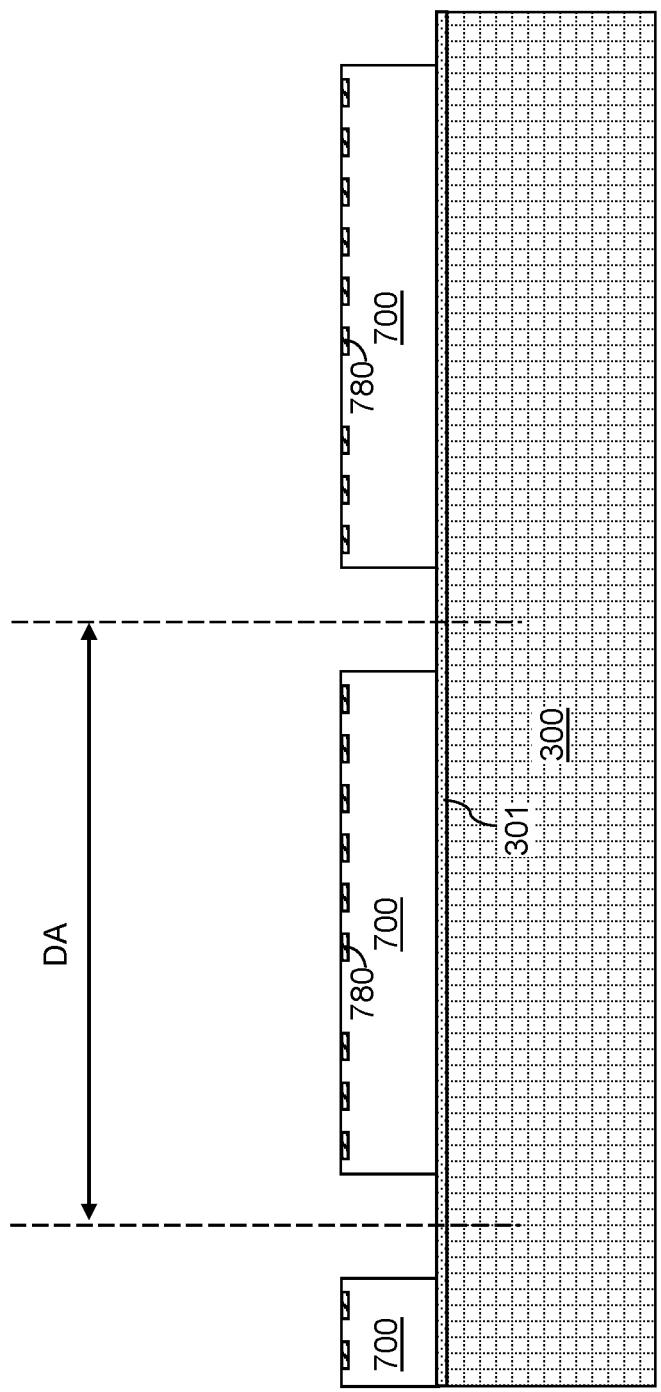
FIG. 1A is a vertical cross-sectional view of a region of an exemplary structure that includes a carrier substrate and semiconductor dies according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and particularly to die corner removal for underfill crack suppression in semiconductor die packaging. Generally, the methods and structures of the present disclosure may be used to provide a chip package structure such as a fan-out wafer level package (FOWLP) and fan-out panel level package (FOPLP). While the present disclosure is described employing an FOWLP configuration, the methods and structures of the present disclosure may be implemented in an FOPLP configuration or any other fan-out package configuration. The various embodiment chip package structures may have enhanced resistance to crack generation in an underfill material portion that laterally surrounds the fan-out package. The fan-out package may be formed with chamfer regions at corners that contact the underfill material portion. The chamfer regions may have angled surfaces that are not horizontal and not vertical. The angled surfaces connect the horizontal surfaces and the vertical surfaces of the fan-out package such that sharp corners may be replaced with the angled surfaces. The angled surfaces alter stress distribution in a manner that eliminates stress concentration points. Thus, embodiment fan-out package of the present disclosure may be more resistant to crack generation and/or crack propagation under mechanical shock. The various aspects and embodiments of the methods and structures of the present disclosure are now described with reference to accompanying drawings.

Figure 1B:
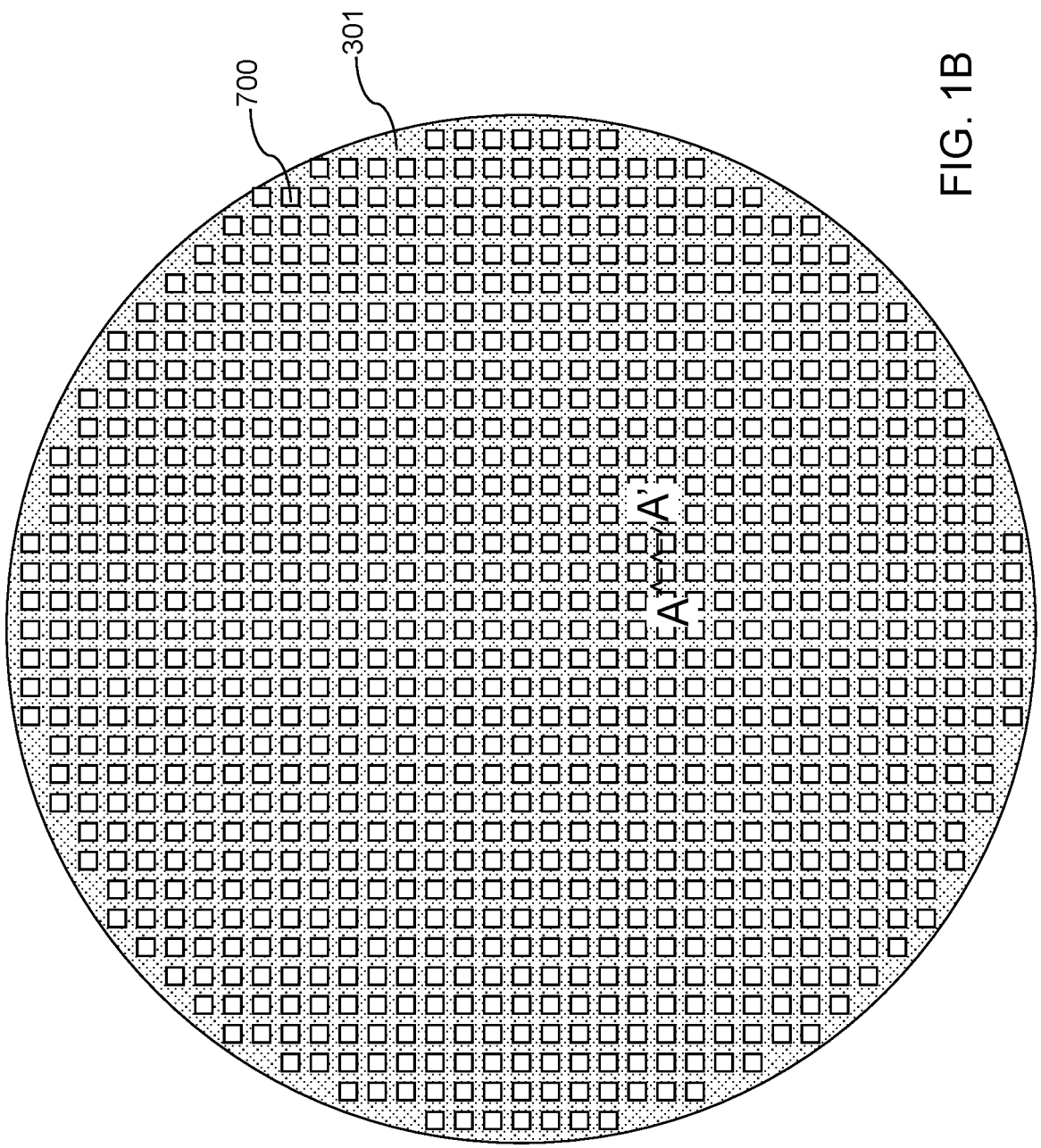
FIG. 1B is a top-down view of the exemplary structure of FIG. 1A.

Referring to FIGS. 1A and 1B, an exemplary structure according to an embodiment of the present disclosure includes a carrier substrate 300 and semiconductor dies 700 disposed on the carrier substrate 300 as a two-dimensional array for formation of a fan-out package. The carrier substrate 300 may include an optically transparent substrate such as a glass substrate or a sapphire substrate. The diameter of the carrier substrate 300 may be in a range from 150 mm to 290 mm, and the thickness of the carrier substrate 300 may be in a range from 500 microns to 2,000 microns. Alternatively, the carrier substrate 300 may be provided in a rectangular panel format.

An adhesive layer 301 may be attached to the front-side surface of the carrier substrate 300. In one embodiment, the adhesive layer 301 may be a light-to-heat conversion (LTHC) layer. The LTHC layer may be a solvent-based coating applied using a spin coating method. The LTHC layer may convert ultraviolet light to heat, which may cause the material of the LTHC layer to lose adhesion. For example, the LTHC layer may include Light-To-Heat Conversion Release Coating (LTHC) Ink™ that is commercially available from The 3M Company®. Alternatively, the adhesive layer 301 may include a thermally decomposing adhesive material. For example, the adhesive layer 301 may include an acrylic pressure-sensitive adhesive that decomposes at an elevated temperature. The debonding temperature of the thermally decomposing adhesive material may be in a range from 150 degrees to 200 degrees.

The semiconductor dies 700 may be placed over the carrier substrate 300 as a two-dimensional periodic rectangular array. The semiconductor dies 700 may be positioned in a face-up position, i.e., in a manner in which the bonding pads 780 on the semiconductor dies 700 face up and do not contact the adhesive layer 301. The backside surface of each semiconductor die 700 may contact the adhesive layer 301. Each semiconductor die 700 may be placed within a respective die area DA. Placement of the semiconductor dies 700 on the carrier substrate 300 may be performed using a pick and place apparatus. Each semiconductor substrate 700 may be attached to the carrier substrate 300 through the adhesive layer 301.

The semiconductor dies 700 may include any semiconductor die known in the art. For example, the semiconductor dies 700 may include a system-on-chip (SoC) die such as an application processor die, a central processing unit die, a graphic processing unit die, or a memory die such as a high bandwidth memory (HBM) die that includes a vertical stack of static random access memory dies.

Figure 2:
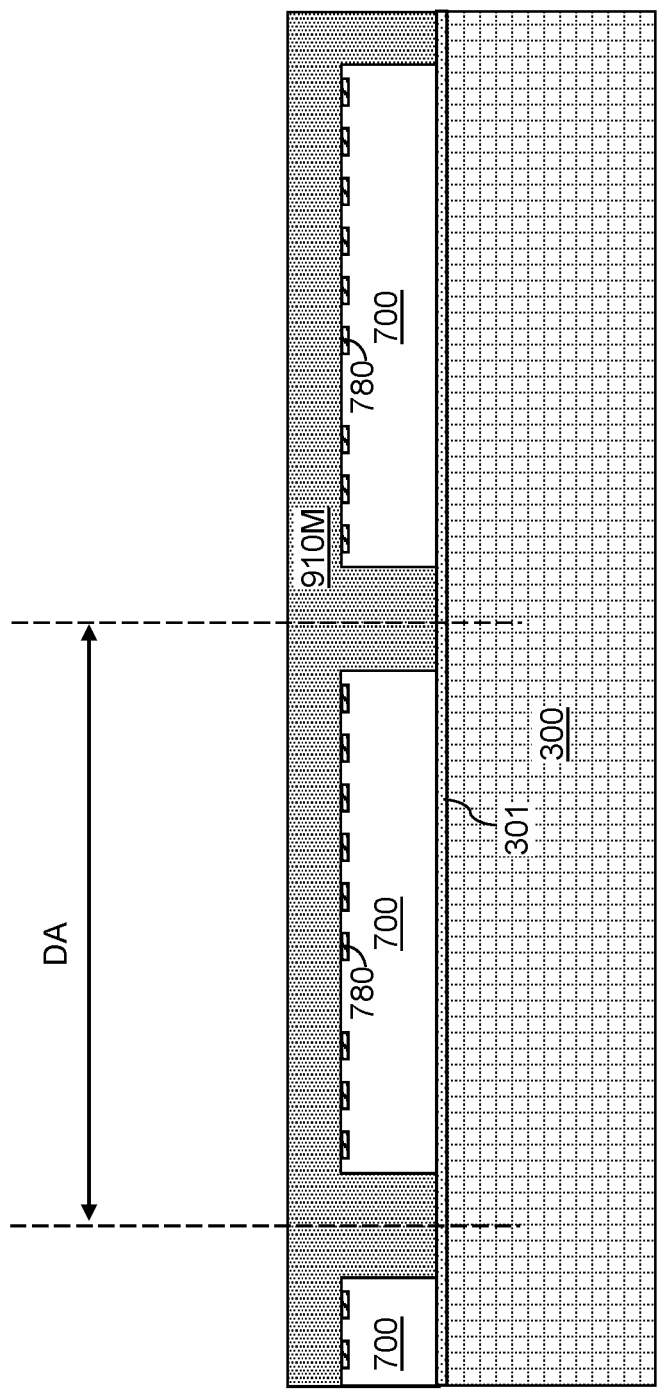
FIG. 2 is vertical cross-sectional view of a region of the exemplary structure after formation of an epoxy molding compound (EMC) matrix according to an embodiment of the present disclosure.

Referring to FIG. 2, an epoxy molding compound (EMC) may be applied to the gaps between the semiconductor dies 700 that are adhered to the carrier substrate 300. The EMC may include an epoxy-containing compound that may be hardened (i.e., cured) to provide a dielectric material portion having sufficient stiffness and mechanical strength. The EMC may include epoxy resin, hardener, silica (as a filler material), and other additives. The EMC may be provided in a liquid form or in a solid form depending on the viscosity and flowability. Liquid EMC provides better handling, good flowability, less voids, better fill, and less flow marks. Solid EMC provides less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks, and may enhance flowability. The curing temperature of the EMC may be lower than the release (debonding) temperature of the adhesive layer 301 if the adhesive layer includes a thermally debonding material. For example, the curing temperature of the EMC may be in a range from 125° C. to 150° C.

The EMC may be cured at a curing temperature to form an EMC matrix 910M that laterally surrounds and embeds each of the semiconductor dies 700. The EMC matrix 910M includes a plurality of epoxy molding compound (EMC) die frames that may be laterally adjoined to one another. Each EMC die frame is a portion of the EMC matrix that is located within a respective die area DA. Thus, each EMC die frame laterally surrounds and embeds a respective semiconductor die 700.

Figure 3:
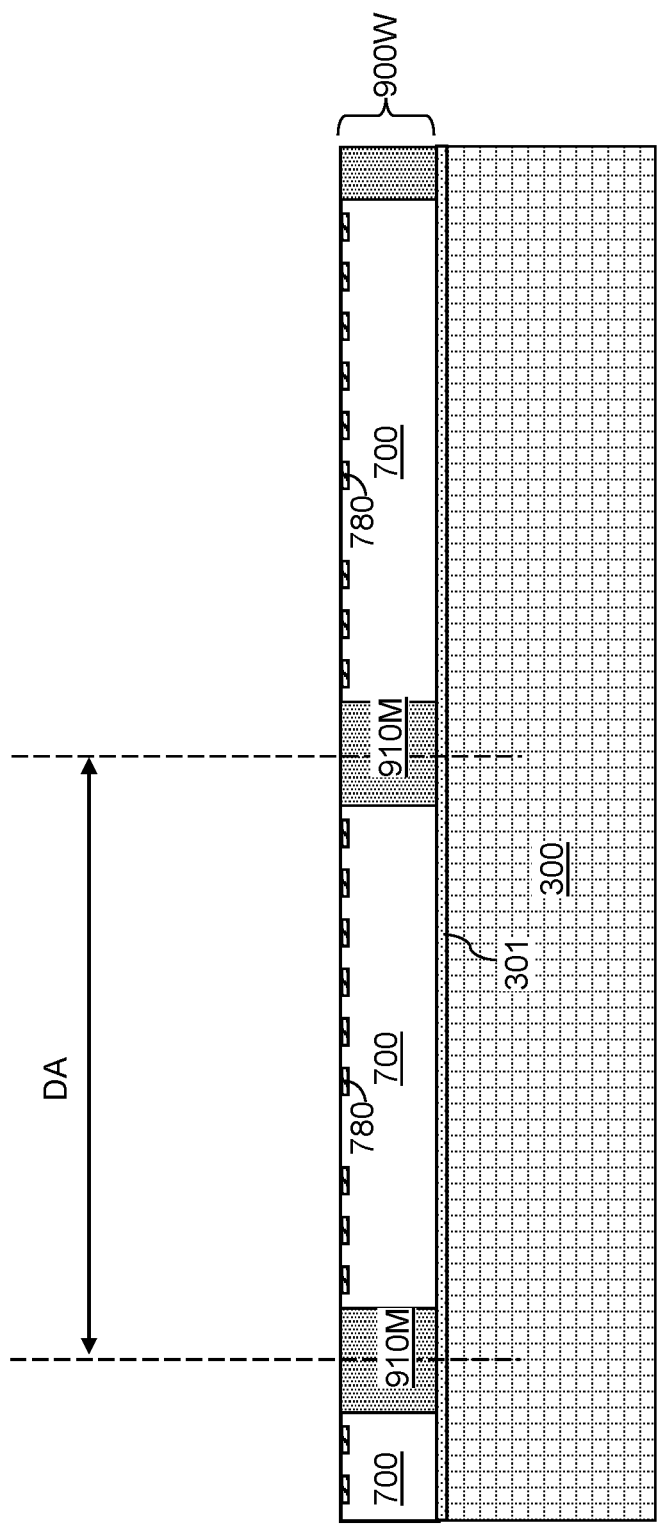
FIG. 3 is a vertical cross-sectional view of a region of the exemplary structure after planarization of the epoxy molding compound (EMC) matrix according to an embodiment of the present disclosure.

Referring to FIG. 3, portions of the EMC matrix 910M that overlies the horizontal plane including the top surfaces of the semiconductor dies 700 may be removed by a planarization process. For example, the portions of the EMC matrix 910M that overlies the horizontal plane may be removed using a chemical mechanical planarization. The combination of the remaining portion of the EMC matrix 910M and the two-dimensional array of semiconductor dies 700 embedded in the EMC matrix 910M comprises a reconstituted wafer 900W. Each portion of the EMC matrix 910M located within a die area DA constitutes an EMC die frame.

Figure 4:
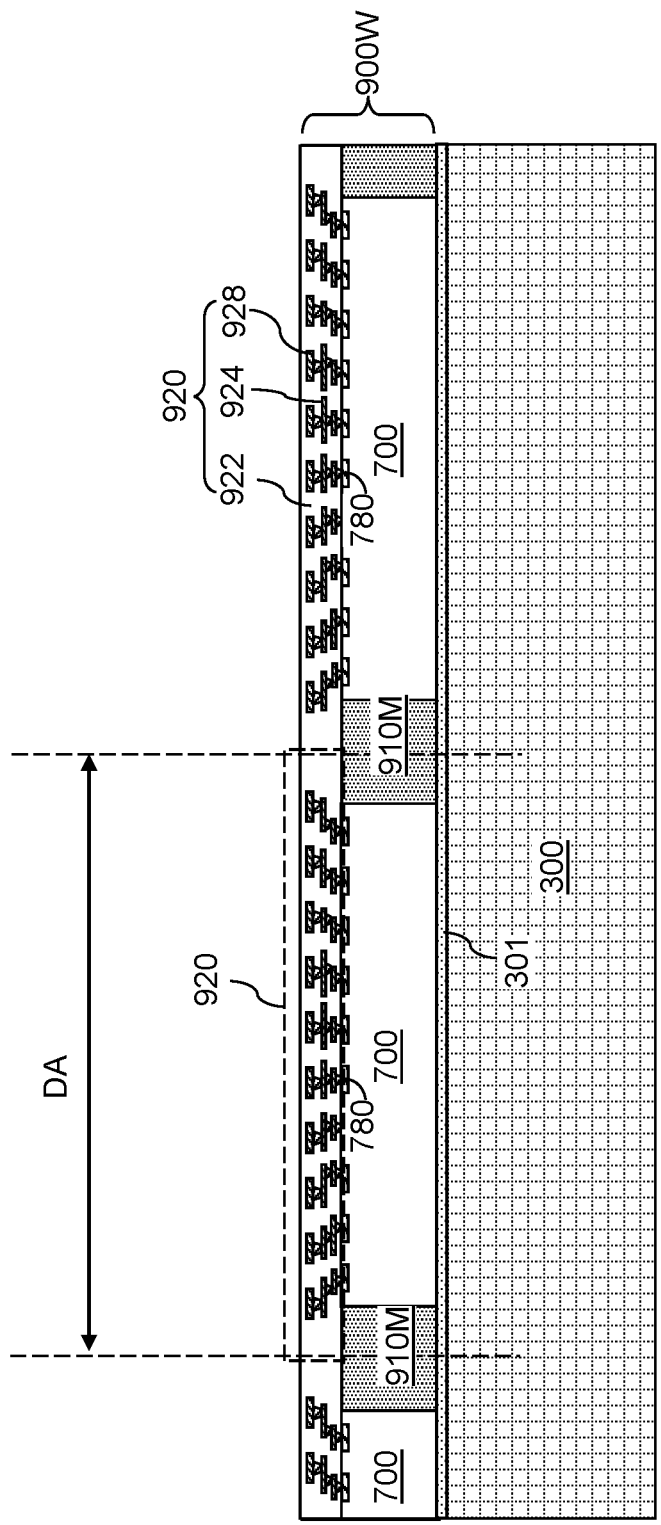
FIG. 4 is a vertical cross-sectional view of a region of the exemplary structure after formation of redistribution structures according to an embodiment of the present disclosure.

Referring to FIG. 4, redistribution structures 920 may be formed on the semiconductor dies 700 and the EMC matrix 910M. Specifically, a redistribution structure 920 may be formed within each die area DA of the reconstituted wafer 900W. The redistribution structures 920 are redistribution structures that are formed on the die side, i.e., the side that faces semiconductor dies to be subsequently attached. The redistribution structures 920 may be incorporated into the reconstituted wafer 900W.

Each redistribution structure 920 may include redistribution dielectric layers 922, redistribution wiring interconnects 924, and fan-out bonding pads 928. The redistribution dielectric layers 922 include a respective dielectric polymer material such as polyimide (PI), benzocyclobutene (BCB), or polybenzobisoxazole (PBO). Other suitable materials may be within the contemplated scope of disclosure. Each redistribution dielectric layer 922 may be formed by spin coating and drying of the respective dielectric polymer material. The thickness of each redistribution dielectric layer 922 may be in a range from 2 microns to 40 microns, such as from 4 microns to 20 microns. Each redistribution dielectric layer 922 may be patterned, for example, by applying and patterning a respective photoresist layer thereabove, and by transferring the pattern in the photoresist layer into the redistribution dielectric layer 922 using an etch process such as an anisotropic etch process. The photoresist layer may be subsequently removed, for example, by ashing.

Each of the redistribution wiring interconnects 924 and the fan-out bonding pads 928 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 300 nm, and the copper seed layer may have a thickness in a range from 100 nm to 500 nm. The metallic fill material for the redistribution wiring interconnects 924 may include copper, nickel, or copper and nickel. The thickness of the metallic fill material that is deposited for each redistribution wiring interconnect 924 may be in a range from 2 microns to 40 microns, such as from 4 microns to 10 microns, although lesser or greater thicknesses may also be used. The total number of levels of wiring in each redistribution structure 920 (i.e., the levels of the redistribution wiring interconnects 924) may be in a range from 1 to 10. Other suitable materials are within the contemplated scope of disclosure.

The metallic fill material for the fan-out bonding pads 928 may include copper. Other suitable materials are within the contemplated scope of disclosure. The thickness of the metallic fill material that is deposited for the fan-out bonding pads 928 may be in a range from 5 microns to 100 microns, although lesser or greater thicknesses may also be used. The fan-out bonding pads 928 may have horizontal cross-sectional shapes of rectangles, rounded rectangles, or circles. Other suitable shapes are within the contemplated scope of disclosure. In embodiments in which the fan-out bonding pads 928 are formed as C4 (controlled collapse chip connection) pads, the thickness of the fan-out bonding pads 928 may be in a range from 5 microns to 50 microns, although lesser or greater thicknesses may also be used. Alternatively, the fan-out bonding pads 928 may be configured for microbump bonding (i.e., C2 bonding), and may have a thickness in a range from 30 microns to 100 microns, although lesser or greater thicknesses may also be used. In such an embodiment, the fan-out bonding pads 928 may be formed as an array of microbumps (such as copper pillars) having a lateral dimension in a range from 10 microns to 25 microns, and having a pitch in a range from 20 microns to 50 microns. The layer including all redistribution structures 920 is herein referred to as a redistribution structure layer.

Generally, a redistribution structure layer including fan-out bonding pads 928 may be formed over the EMC matrix 910M and the two-dimensional array of semiconductor dies 700. The redistribution structure layer includes a two-dimensional array of redistribution structures 920. Each redistribution structure 920 is formed within a respective die area DA. Each redistribution structure 920 may comprise redistribution dielectric layers 922, redistribution wiring interconnects 924 embedded in the redistribution dielectric layers 922, and fan-out bonding pads 928. The redistribution wiring interconnects 924 laterally extend over, and across, a boundary between the semiconductor die 700 and the EMC matrix 910M in a plan view along a vertical plane that is perpendicular to the top surface of the carrier substrate 300.

Figure 5:
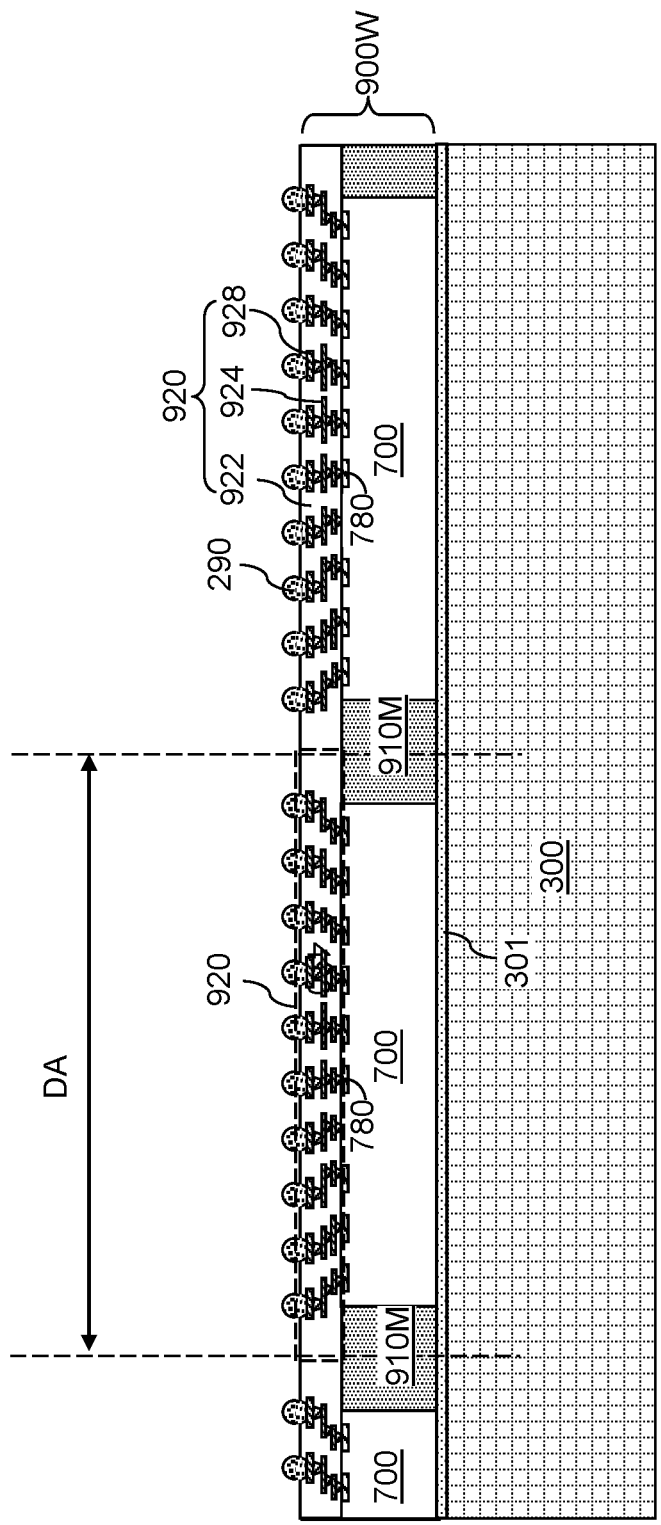
FIG. 5 is a vertical cross-sectional view of a region of the exemplary structure after formation of solder material portions according to an embodiment of the present disclosure.

Referring to FIG. 5, solder material portions 290 may be attached to the fan-out bonding pads 928. In embodiments in which the fan-out bonding pads 928 include C4 bonding pads, the solder material portions 290 may be C4 solder balls, i.e., solder material portions in the shapes of balls that may be used for C4 bonding. In embodiments in which the fan-out bonding pads 928 include an array of microbumps for C2 bonding, the solder material portions 290 may be solder caps that wet the entirety of a planar end surface of a respective microbump and have generally hemispherical shapes. In one embodiment, the solder material portions 290 may comprise an array of cylindrical copper pillars each having a horizontal cross-sectional shape of a circle with a diameter in a range from 10 microns to 25 microns. While the present disclosure is described using an embodiment in which the solder material portions 290 are represented by spherical C4 solder material portions, embodiments are expressly contemplated herein in which the solder material portions 290 are solder caps having hemispherical shapes.

Figure 6:
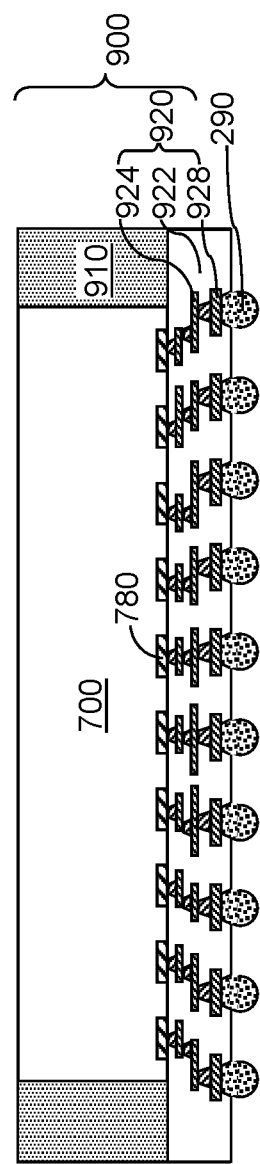
FIG. 6 is a vertical cross-sectional view of a fan-out wafer level package obtained by detaching the carrier substrate from the exemplary structure of FIG. 4 and by singulating the reconstituted wafer of FIG. 4 according to an embodiment of the present disclosure.

Referring to FIG. 6, the adhesive layer 301 may be decomposed by ultraviolet radiation or by a thermal anneal at a debonding temperature. In embodiments in which the carrier substrate 300 includes an optically transparent material and the adhesive layer 301 includes an LTHC layer, the adhesive layer 301 may be decomposed by irradiating ultraviolet light through the transparent carrier substrate. The LTHC layer may be absorb the ultraviolet radiation and generate heat, which decomposes the material of the LTHC layer and cause the transparent carrier substrate to be detached from the reconstituted wafer 900W. In embodiments in which the adhesive layer 301 includes a thermally decomposing adhesive material, a thermal anneal process at a debonding temperature may be performed to detach the reconstituted wafer 900W from the carrier substrate 300.

The reconstituted wafer 900W with the attached solder material portions 290 thereupon may be subsequently diced along dicing channels by performing a dicing process. The dicing channels correspond to the boundaries between neighboring pairs of die areas DA. Each diced unit from the reconstituted wafer 900W comprises a fan-out wafer level package (FOWLP) 900. In other words, each diced portion of the assembly of the two-dimensional array of semiconductor dies 700, the EMC matrix 910M, and the two-dimensional array of redistribution structures 920 include a FOWLP 900. Each diced portion of the EMC matrix 910M constitutes an epoxy molding compound (EMC) die frame 910. Each diced portion of the redistribution structure layer (which includes the two-dimensional array of redistribution structures 920) constitutes a redistribution structure 920.

Each FOWLP 900 may include a semiconductor die 700 with bonding pads 780, an epoxy molding compound (EMC) die frame 910 laterally surrounding the semiconductor die 700, and a redistribution structure 920 located on horizontal surfaces of the semiconductor die 700 and the EMC die frame 910. In the illustrated example, the solder material portions 290 may be attached to the fan-out bonding pads 920 prior to dicing the reconstituted wafer 900W. Each redistribution structure 920 comprises a portion of the redistribution structure layer that remains in the FOWLP 900, and the EMC die frame 910 comprises a portion of the EMC matrix 910M that remains in the FOWLP 900.

Figure 7A:
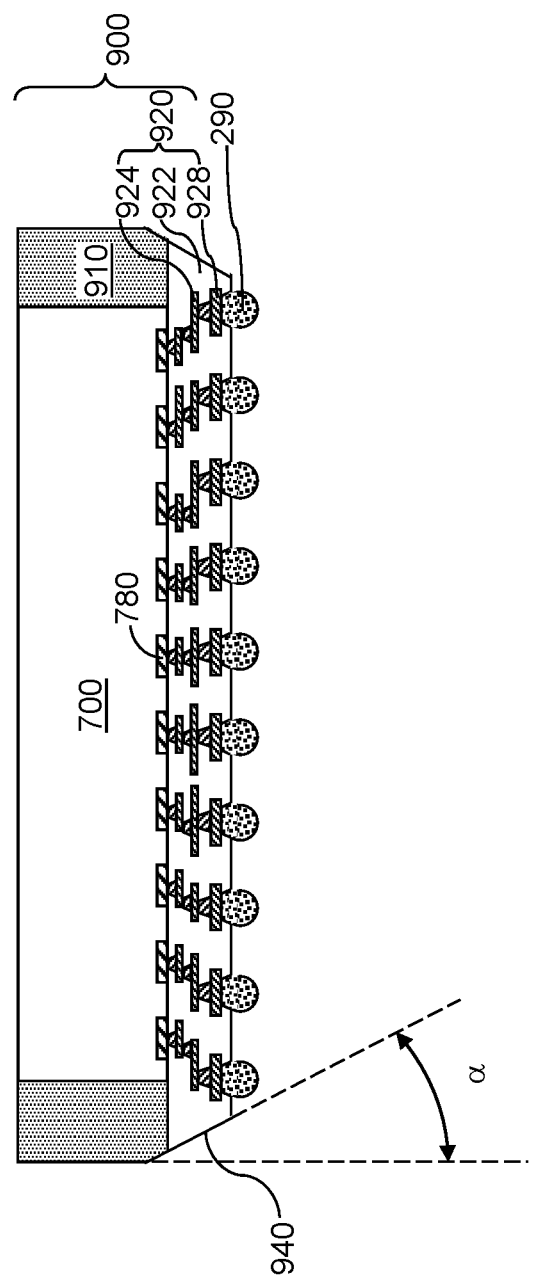
FIG. 7A is a vertical cross-sectional view of a first configuration of the fan-out wafer level package after formation of angled surfaces in chamfer regions according to an embodiment of the present disclosure.
Figure 7B:
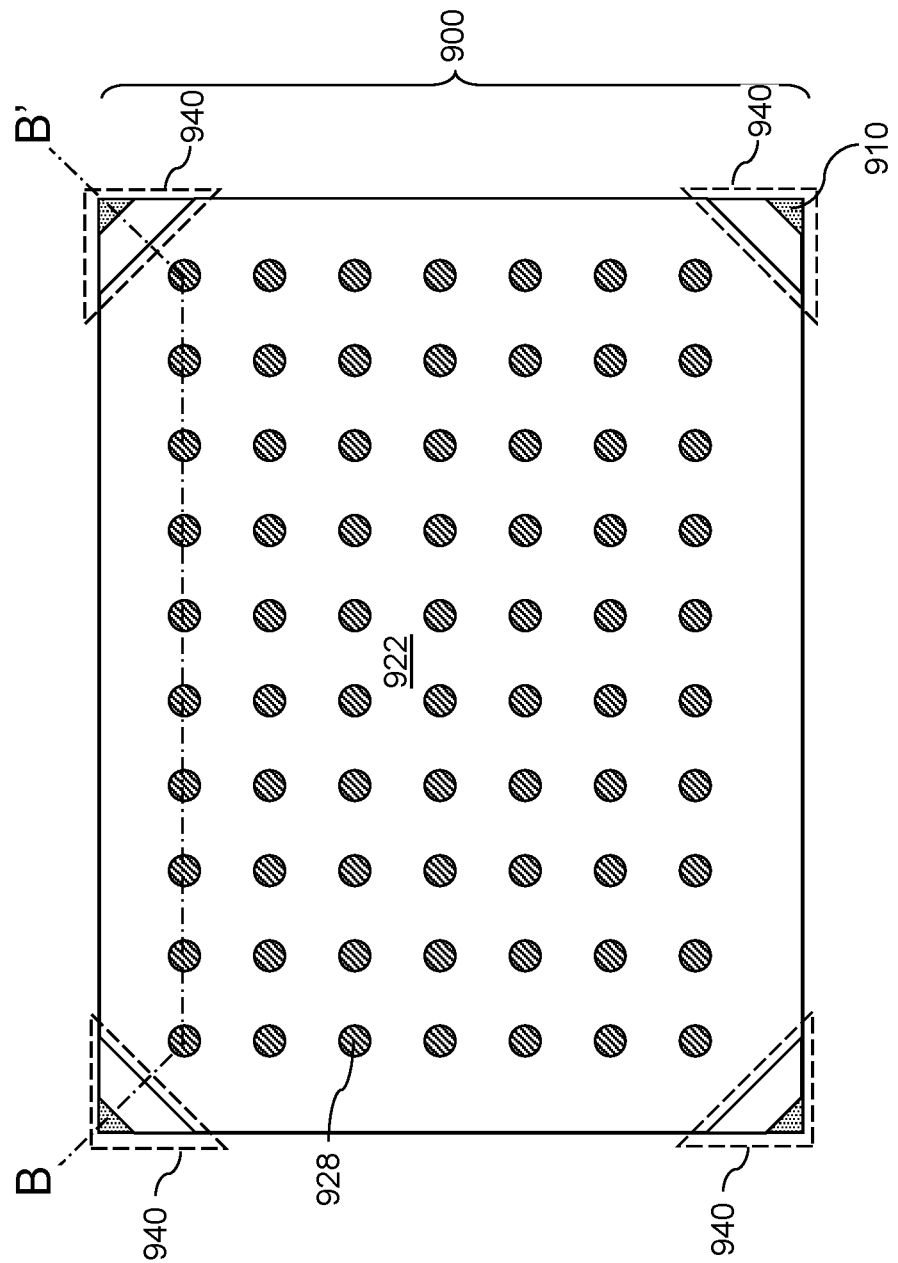
FIG. 7B is a bottom-up view of the first configuration of the fan-out wafer level package of FIG. 7A.

Referring to FIGS. 7A and 7B, a first configuration of the fan-out wafer level package (FOWLP) 900 is illustrated after formation of angled surfaces 940 in chamfer regions according to an embodiment of the present disclosure. Each chamfer region includes a volume that contains an entirety of an angled surface 940 at a corner of the FOWLP 900 that is located around the array of solder material portions 290.

The angled surfaces 940 (i.e., chamfered surfaces or beveled surfaces) in the chamfer regions are not horizontal and are not vertical. In one embodiment, the angled surfaces 940 may be formed by chamfering the corner portions of the redistribution structure 920 and the EMC die frame 910 after dicing the reconstituted wafer 900W.

In one embodiment, the FOWLP 900 may have a rectangular horizontal cross-sectional shape. In such an embodiment, the FOWLP 900 comprises four chamfer regions located at four corners of a horizontal surface of the FOWLP 900 to which the solder material portions 290 are attached. Edges of the angled surfaces 940 may be adjoined to vertical sidewalls of the EMC die frame 910, vertical sidewalls of the redistribution structure 920, and a horizontal surface of the redistribution structure 920 to which an array of solder material portions 290 is attached. In one embodiment, each angled surface 940 may be adjoined to a pair of vertical sidewalls of the EMC die frame 910, a pair of vertical sidewalls of the redistribution structure 920, and the horizontal surface of the redistribution structure 920 to which the array of solder material portions 290 is attached.

In one embodiment, each angled surface 940 may be formed by chamfering a portion of the redistribution structure 920 and by chamfering a portion of the EMC die frame 910. In such an embodiment, each of the angled surfaces 940 may comprise an angled redistribution structure surface segment including a respective surface of redistribution dielectric layers 922 within the redistribution structure 920, and an angled EMC die frame surface segment including a respective surface of the EMC die frame 910. The top surface of the FOWLP 900 may be planar. Thus, a horizontal surface of the semiconductor die 700 may be located within the same horizontal plane as a distal horizontal surface of the FOWLP 900 that is not in contact with any solder material portion 290.

Each redistribution structure 920 may comprise redistribution dielectric layers 922. Each of the redistribution dielectric layers 922 may comprise a respective surface segment of each of the angled surfaces 940. Redistribution wiring interconnects 924 may be embedded in the redistribution dielectric layers 922. Fan-out bonding pads 928 may be bonded to the array of solder material portions 290. The redistribution wiring interconnects 924 laterally extend over, and across, a boundary between the semiconductor die 700 and the EMC die frame 910.

In the first embodiment of the FOWLP 900, removal of the corner portions of the redistribution structure 920 and the EMC die frame 910 may be performed by a bevel cut process. The bevel cut process may use an angled cutting process using a saw, an angled polishing process, and/or an angled grinding process. The bevel cut process may form the angled surfaces 940 as planar beveled surfaces. Each planar beveled surface may be contained entirely within a two-dimensional Euclidian plane that has a respective non-zero angle within respective to each vertical sidewall of the EMC die frame 910, and has a non-zero angle with respective to the horizontal plane of the redistribution structure 920 from which the array of solder material portions 290 protrudes.

The angle α between each planar beveled surface and the vertical direction may be in a range from 20 degrees to 80 degrees, such as from 30 degrees to 70 degrees. In other words, each of the planar beveled surfaces may be at the angle α in a range from 20 degrees to 80 degrees with respective to the vertical direction. The angle between each planar beveled surface and the vertical sidewalls of the EMC die frame 910 may be in a range from 20 degrees to 80 degrees, such as from 30 degrees to 70 degrees and/or from 40 degrees to 50 degrees. The angle between each planar beveled surface and the horizontal plane including the horizontal plane of the redistribution structure 920 from which the array of solder material portions 290 protrudes may be in a range from 10 degrees to 70 degrees, such as from 20 degrees to 60 degrees and/or from 40 degrees to 50 degrees.

Figure 7C:
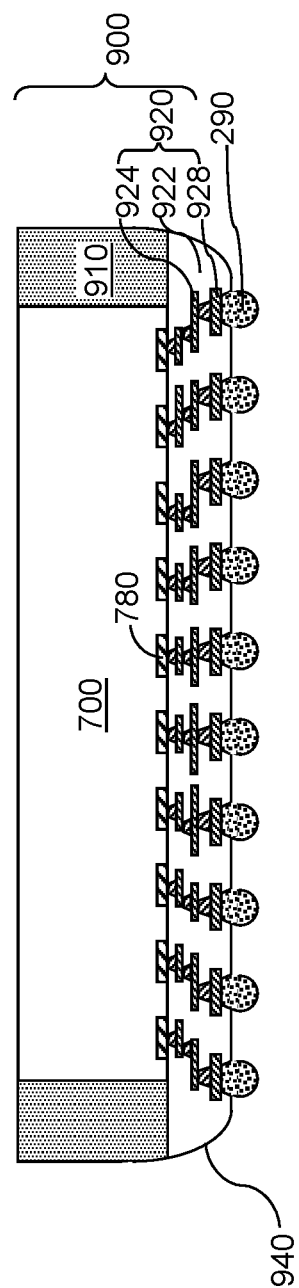
FIG. 7C is a vertical cross-sectional view of a second configuration of the fan-out wafer level package after formation of angled surfaces in chamfer regions according to an embodiment of the present disclosure.

Referring to FIG. 7C, a second embodiment of the fan-out wafer level package 900 is illustrated after formation of angled surfaces 940 in chamfer regions. In such an embodiment, the corner portions of the redistribution structure 920 and the EMC die frame 910 may be performed by a grinding process that forms the angled surfaces 940 as convex surfaces. In one embodiment, each of the angled surfaces 940 may comprise a respective convex surface having a variable taper angle with respective to a vertical direction that decreases with a vertical distance from a horizontal plane including the horizontal surface of the redistribution structure 920 from which the array of solder material portions 290 protrudes. Each angled surface 940 may be adjoined to a pair of vertical sidewalls of the FOWLP 900 at two curved edges, and may be adjoined to a horizontal surface of the redistribution structure 920 at a curved edge.

Generally, each angled surface 940 may be bounded by three edges that are adjoined by three apexes. The three edges may be straight edges in embodiments in which the angled surface 940 is located in a Euclidian two-dimensional plane, or may be curved edges in embodiments in which the angled surface 940 includes a curved surface such as a convex surface or a concave surface. The apex-to-apex distance for each angled surface 940 is greater than the thickness of the redistribution structure 920, and may be in a range from 50 micron to 2 mm, such as from 100 micron to 500 microns, although lesser and greater apex-to-apex distances may also be used.

Figure 8A:
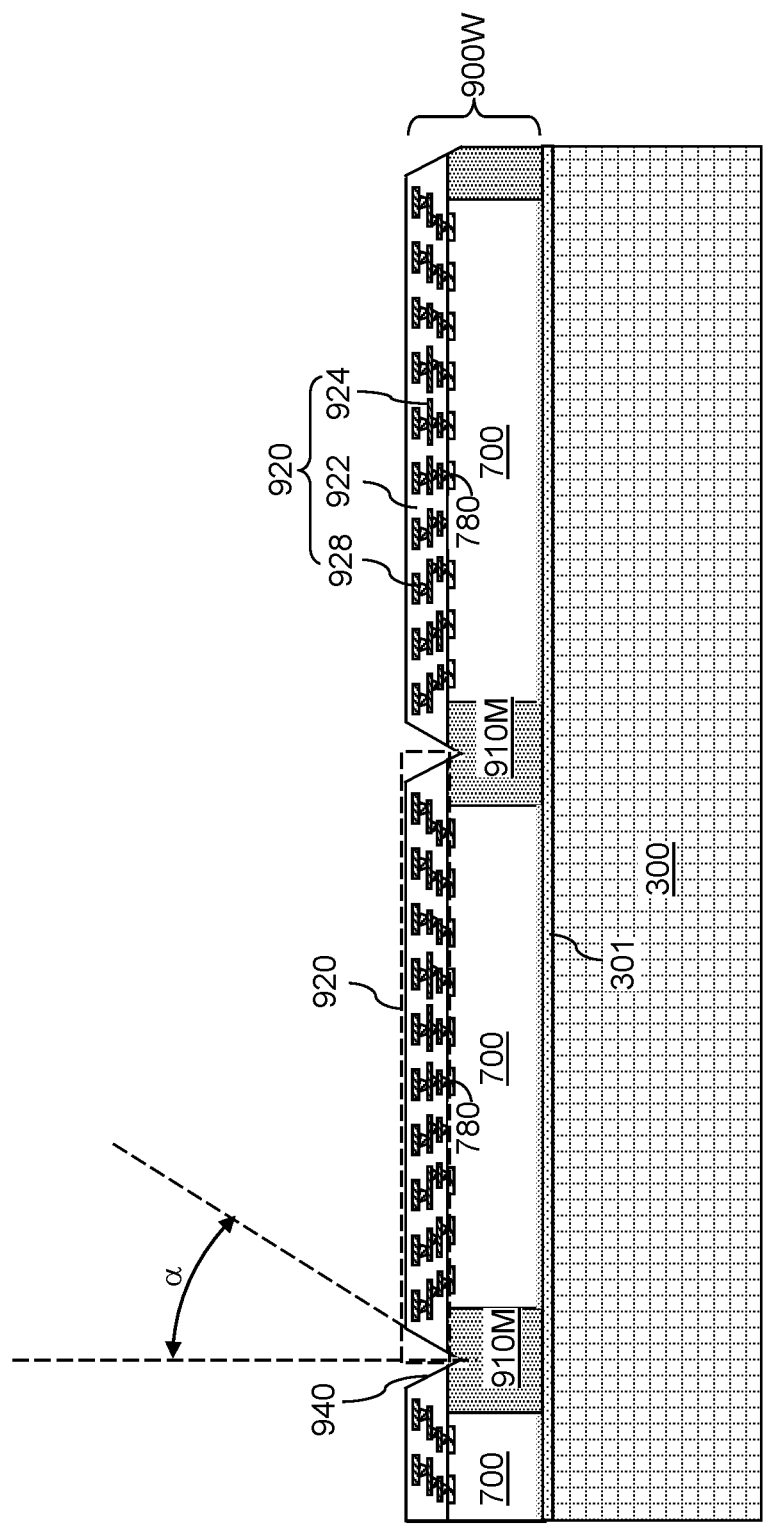
FIG. 8A is a vertical cross-sectional view of a region of an alternative embodiment of the exemplary structure after formation of angled surfaces in chamfer regions according to an embodiment of the present disclosure.
Figure 8B:
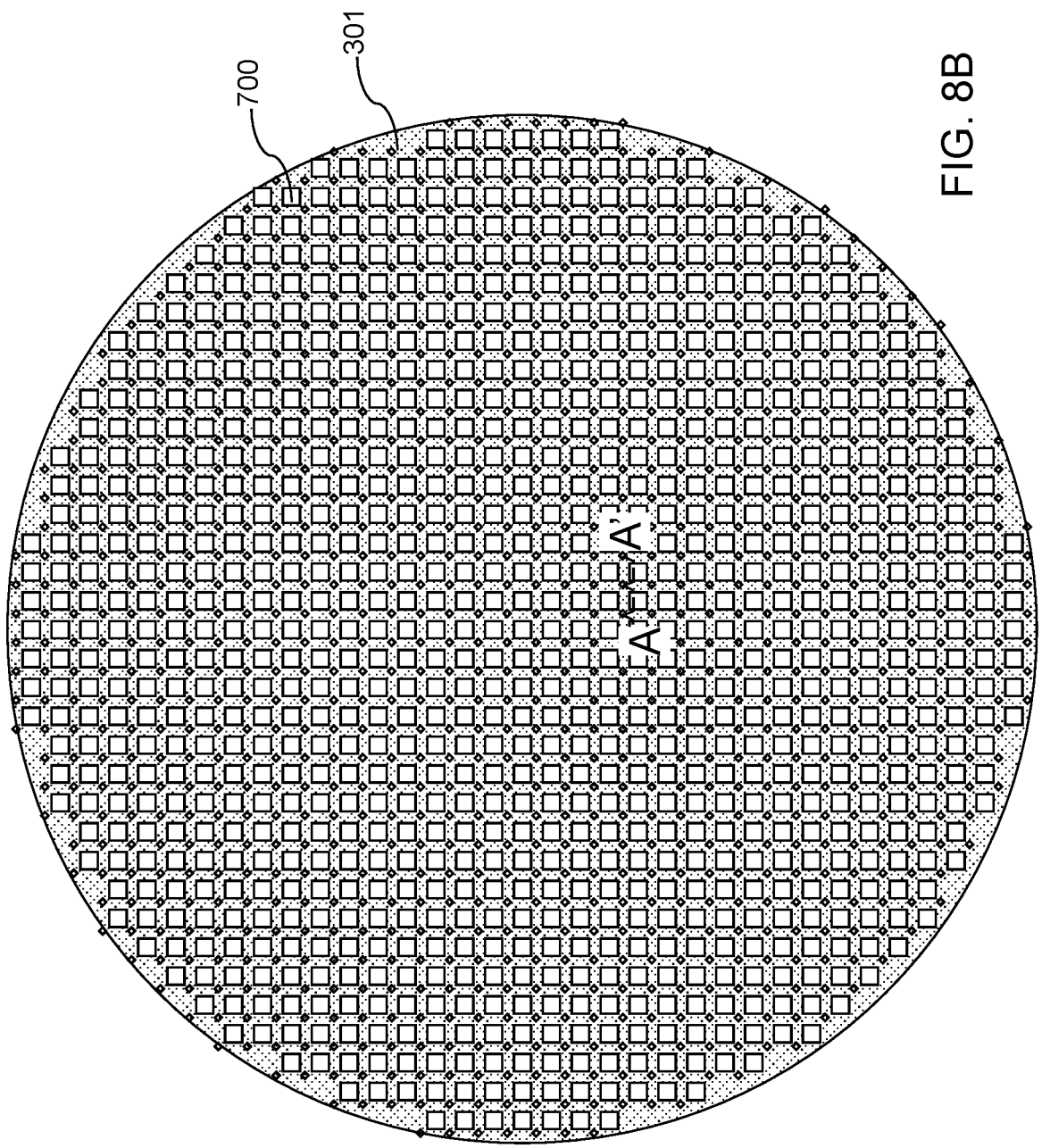
FIG. 8B is a top-down view of the alternative configuration of the exemplary structure of FIG. 8A.
Figure 8C:
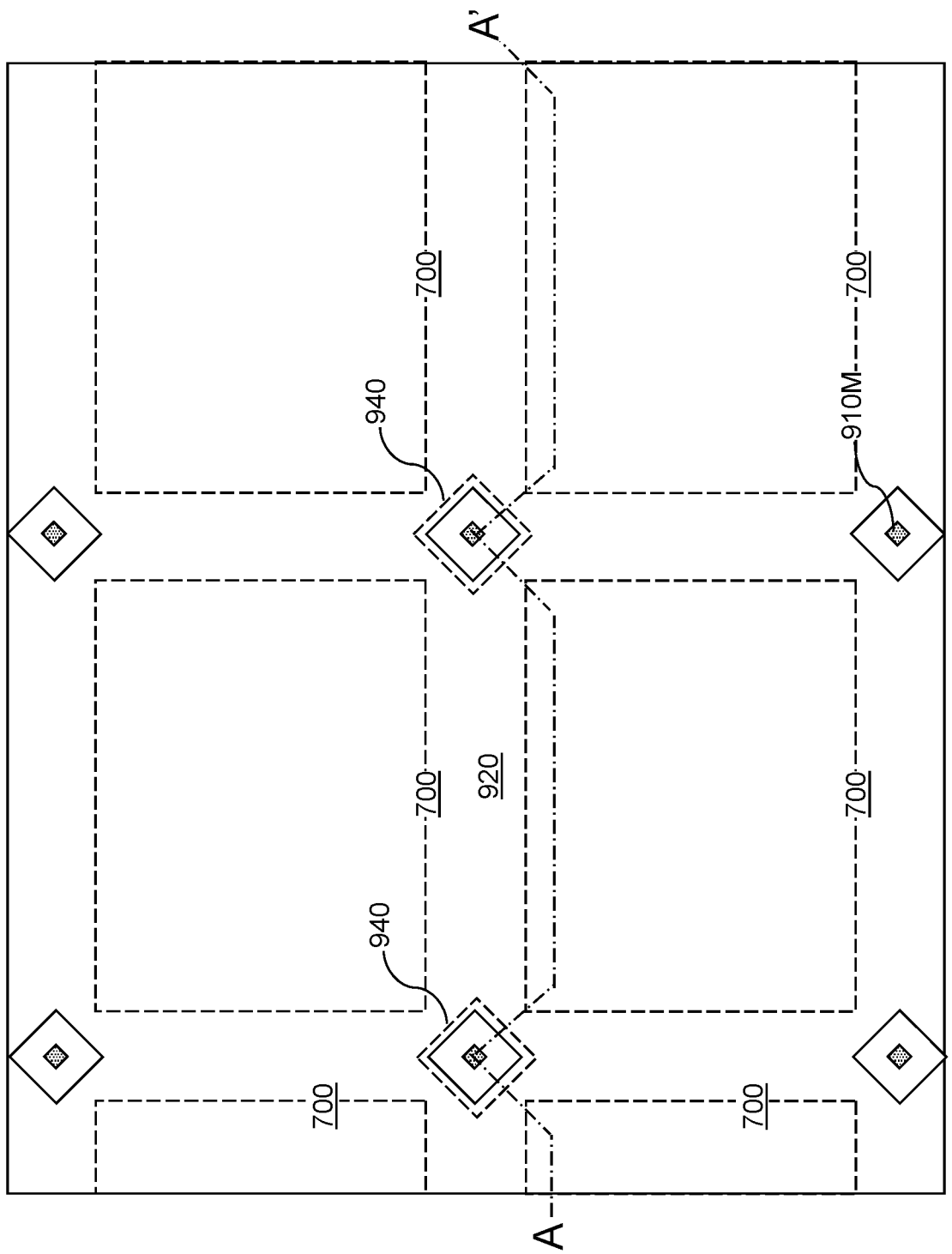
FIG. 8C is a top-down view of a region of the alternative configuration of the exemplary structure of FIGS. 8A and 8B. The hinged vertical plane A-A' corresponds to the plane of the vertical cross-sectional view of FIG. 8A.

Referring to FIGS. 8A-8C, an alternative embodiment of the exemplary structure is illustrated, which may be derived from the exemplary structure of FIG. 4 by forming an array of chamfer regions including angled surfaces 940 prior to singulating the reconstituted wafer 900W. The chamfer regions may be formed at each intersection point of dicing channels that are located at boundaries between neighboring pairs of die areas DA. The chamfer regions may be arranged as a two-dimensional periodic array having the same periodicity as the two-dimensional array of semiconductor dies 700.

In one embodiment, the chamfer regions may be formed as an array of recess cavities having tapered surfaces in the redistribution structure layer prior to dicing the reconstituted wafer 900W. In one embodiment, the recess cavities may be formed, for example, by applying a photoresist layer over the reconstituted wafer 900W of FIG. 4, by forming an array of diamond-shaped openings at each corner of the die areas DA, and by performing at least one etch process using the patterned photoresist layer as an etch mask. The at least one etch process may include at least one isotropic etch process that etches the material(s) of the redistribution structures 920 and/or the material of the EMC matrix 910M, at least one anisotropic etch process that etches the material(s) of the redistribution structures 920 and/or the material of the EMC matrix 910M, or a combination of at least one isotropic etch process and at least one anisotropic etch process. Use of the combination of the at least one isotropic etch process and at least one anisotropic etch process may be advantageous in minimizing formation of concave surfaces around the recess cavities and in providing more planar angled surfaces 940 around the recess cavities.

Figure 9:
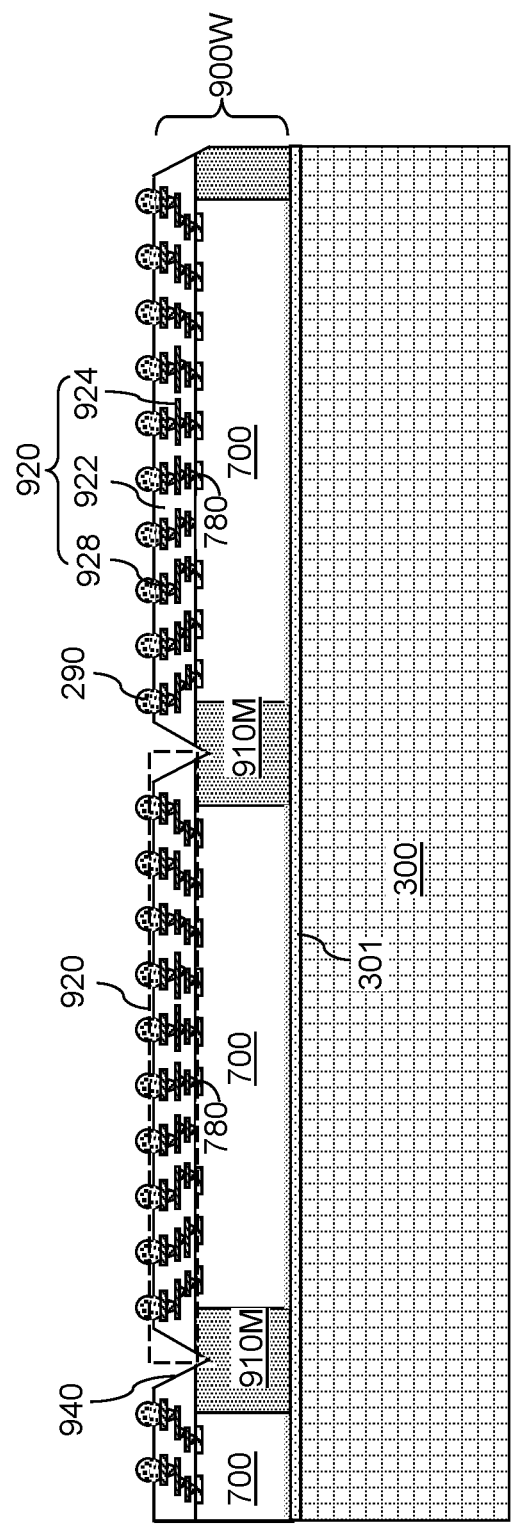
FIG. 9 is a vertical cross-sectional view of a region of the alternative configuration of the exemplary structure after formation of solder material portions according to an embodiment of the present disclosure.

Referring to FIG. 9, the processing steps of FIG. 5 may be performed to attach solder material portions 290 to the fan-out bonding pads 928.

Figure 10A:
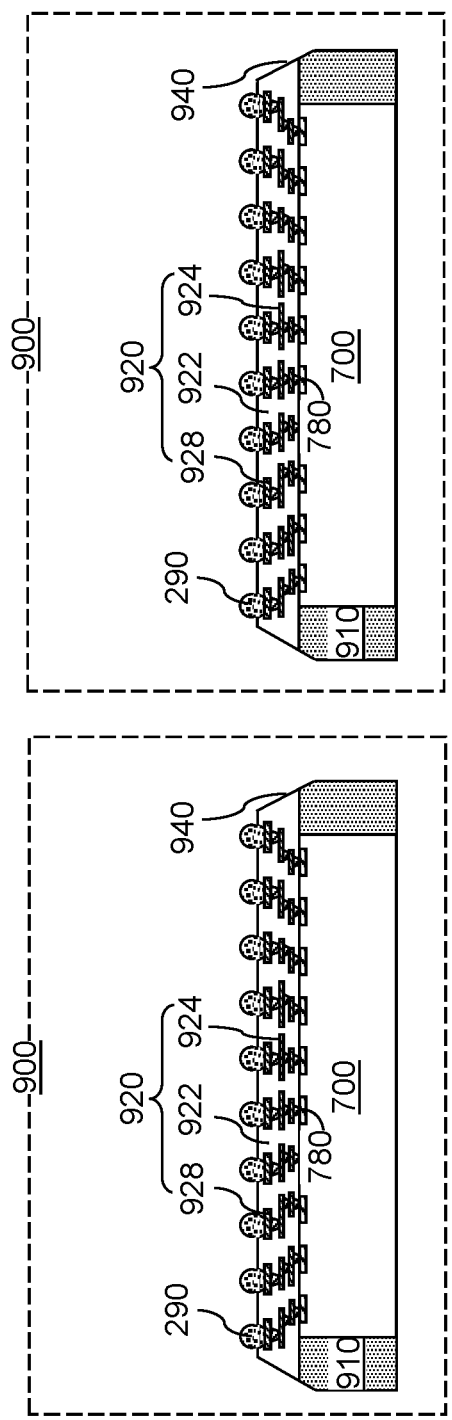
FIG. 10A is a vertical cross-sectional view of fan-out wafer level packages obtained by detaching the carrier substrate from the exemplary structure of FIG. 9 and by singulating the reconstituted wafer of FIG. 9 according to an embodiment of the present disclosure.
Figure 10B:
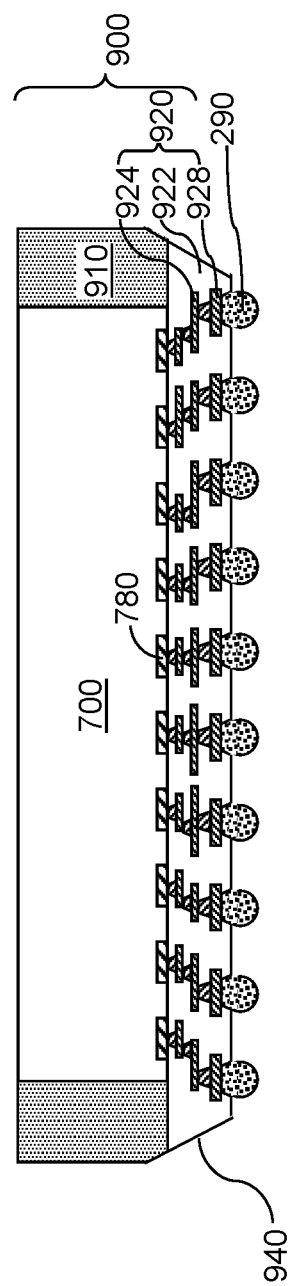
FIG. 10B is a vertical cross-sectional view of a fan-out wafer level package of FIG. 10A after flipping the fan-out wafer level package upside down.
Figure 10C:
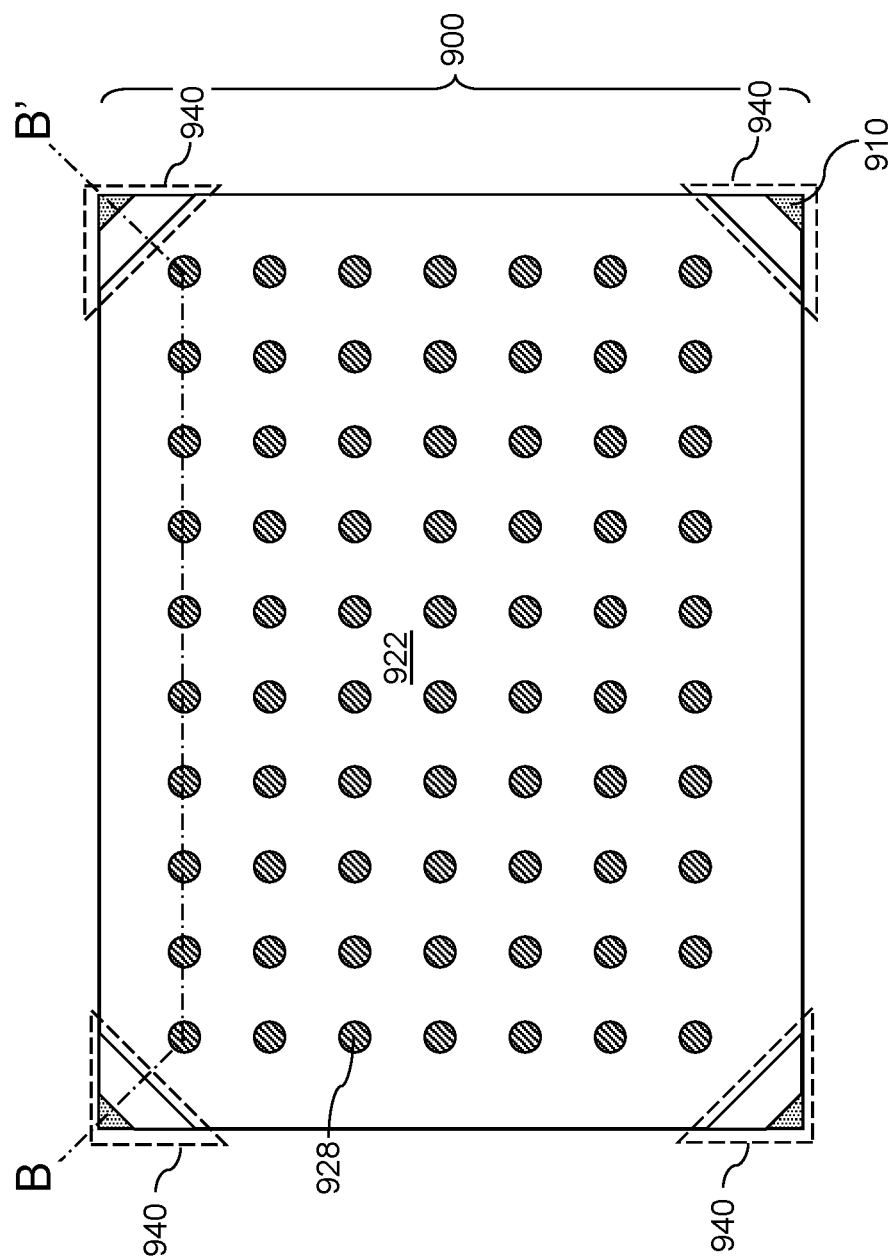
FIG. 10C is a bottom-up view of the fan-out wafer level package of FIG. 10B.

Referring to FIGS. 10A-10C, the processing steps of FIG. 6 may be performed to decompose the adhesive layer 301 and to detach the reconstituted wafer 900W from the carrier substrate 300. The reconstituted wafer 900W with the attached solver material portions 290 thereupon may be subsequently diced along dicing channels by performing a dicing process. The dicing channels correspond to the boundaries between neighboring pairs of die areas DA. Each diced unit from the reconstituted wafer 900W comprises a fan-out wafer level package (FOWLP) 900. Each dicing channel extends through a row of recess cavities or a column of recess cavities.

Each FOWLP 900 may include a semiconductor die 700 with bonding pads 780, an epoxy molding compound (EMC) die frame 910 laterally surrounding the semiconductor die 700, and a redistribution structure 920 located on horizontal surfaces of the semiconductor die 700 and the EMC die frame 910. Each redistribution structure 920 comprises a portion of the redistribution structure layer that remains in the FOWLP 900, and the EMC die frame 910 comprises a portion of the EMC matrix 910M that remains in the FOWLP 900. Chamfer regions may be provided at corners of each FOWLP 900. The chamfer regions comprise angled surfaces 940 that are not horizontal and not vertical. The angled surfaces 940 comprise a subset of the tapered surfaces that are provided on the FOWLPs 900, which are diced portions of the reconstituted wafer 900W.

Optionally, a buffing process or a polishing process may be performed on each FOWLP 900 after the dicing process to remove any concave curvature in the angled surfaces 940 of the FOWLPs 900. The buffing process or the polishing process may form the angled surfaces 940 as planar surfaces contained entirely within a respective two-dimensional Euclidean plane, or as convex surfaces. The shape of each FOWLP 900 formed using the processing steps of FIGS. 8A-8C and 9 may be identical to the shape of a FOWLP 900 provided at the processing steps of FIGS. 7A and 7B or at the processing steps of FIG. 7C.

Figure 11:
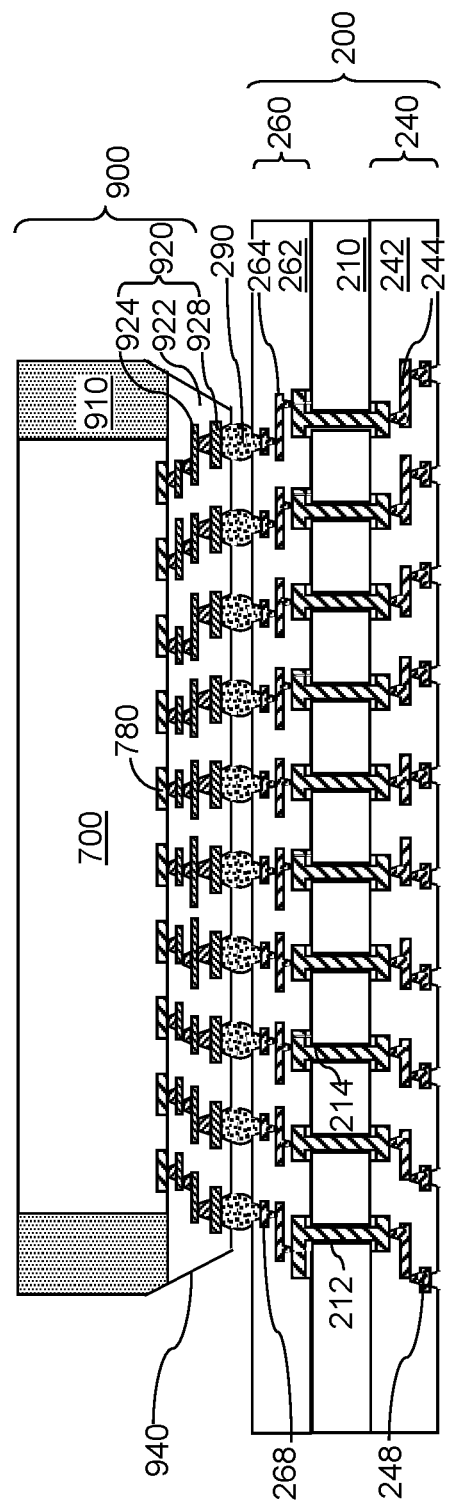
FIG. 11 is a vertical cross-sectional view of a first exemplary structure obtained by bonding a fan-out wafer level package in a first configuration to a package substrate according to an embodiment of the present disclosure.

Referring to FIG. 11, a package substrate 200 may be provided. The package substrate 200 may be a cored package substrate including a core substrate 210, or a coreless package substrate that does not include a package core. Alternatively, the package substrate 200 may include a system-integrated package substrate (SoIS) including redistribution layers and/or dielectric interlayers, at least one embedded interposer (such as a silicon interposer). Such a system-integrated package substrate may include layer-to-layer interconnections employing solder material portions, microbumps, underfill material portions (such as molded underfill material portions), and/or an adhesion film. While the present disclosure is described employing an exemplary substrate package, it is understood that the scope of the present disclosure is not limited by any particular type of substrate package and may include a SoIS. The core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners 212 may be used to electrically isolate the through-core via structures 214 from the core substrate 210.

The package substrate 200 may include board-side surface laminar circuit (SLC) 240 and a chip-side surface laminar circuit (SLC) 260. The board-side SLC may include board-side insulating layers 242 embedding board-side wiring interconnects 244. The chip-side SLC 260 may include chip-side insulating layers 262 embedding chip-side wiring interconnects 264. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262.

In one embodiment, the package substrate 200 includes a chip-side surface laminar circuit 260 comprising chip-side wiring interconnects 264 connected to an array of chip-side bonding pads 268 that is bonded to the array of solder material portions 290, and a board-side surface laminar circuit 240 including board-side wiring interconnects 244 connected to an array of board-side bonding pads 248. The array of board-side bonding pads 248 is configured to allow bonding through solder balls. The array of chip-side bonding pads 268 is configured to allow bonding through C4 solder balls. Generally, any type of package substrate 200 may be employed. While the present disclosure is described employing an embodiment in which the package substrate 200 includes a chip-side surface laminar circuit 260 and a board-side surface laminar circuit 240, embodiments are expressly contemplated herein in which one of the chip-side surface laminar circuit 260 and the board-side surface laminar circuit 240 is omitted, or is replaced with an array of bonding structures such as microbumps. In an illustrative example, the chip-side surface laminar circuit 260 may be replaced with an array of microbumps or any other array of bonding structures.

The solder material portions 290 attached to the fan-out bonding pads 928 of the FOWLP 900 may be disposed on the array of the chip-side bonding pads 268 of the package substrate 200. A reflow process may be performed to reflow the solder material portions 290, thereby inducing bonding between the FOWLP 900 and the package substrate 200. In one embodiment, the solder material portions 290 may include C4 solder balls, and the FOWLP 900 may be attached to the package substrate 200 using an array of C4 solder balls.

Figure 12:
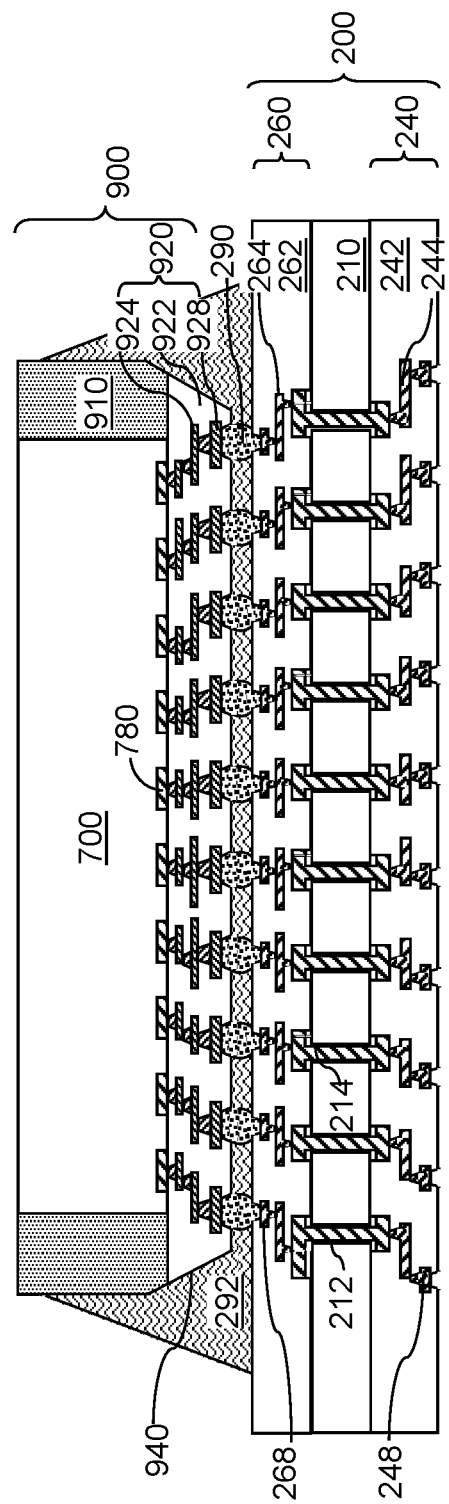
FIG. 12 is a vertical cross-sectional view of the first exemplary structure after application of an underfill material portion according to an embodiment of the present disclosure.

Referring to FIG. 12, an underfill material portion 292 may be formed around the solder material portions 290 by applying and shaping an underfill material. The underfill material portion 292 may be formed around the solder material portions 290 by applying and shaping an underfill material. The underfill material portion 292 may be formed by injecting an underfill material around the array of solder material portions 290 after the solder material portions 490 are reflowed. Any known underfill material application method may be employed, which may be, for example, the capillary underfill method, the molded underfill method, or the printed underfill method.

The underfill material portion 292 laterally surrounds, and contacts, the angled surfaces 940 of the FOWLP 900. The entirety of each angled surface 940 may be contacted by the underfill material portion 292. The underfill material portion 292 may contact each of the solder material portions 292 (which may be C4 solder balls or C2 solder caps), and may contact vertical sidewalls of the FOWLP 900. In an alternative embodiment, each FOWLP 900 may include a plurality of semiconductor dies in lieu of a single semiconductor die 700. In this case, the underfill material portion 292 may continuously extend underneath the plurality of semiconductor dies.

Figure 13A:
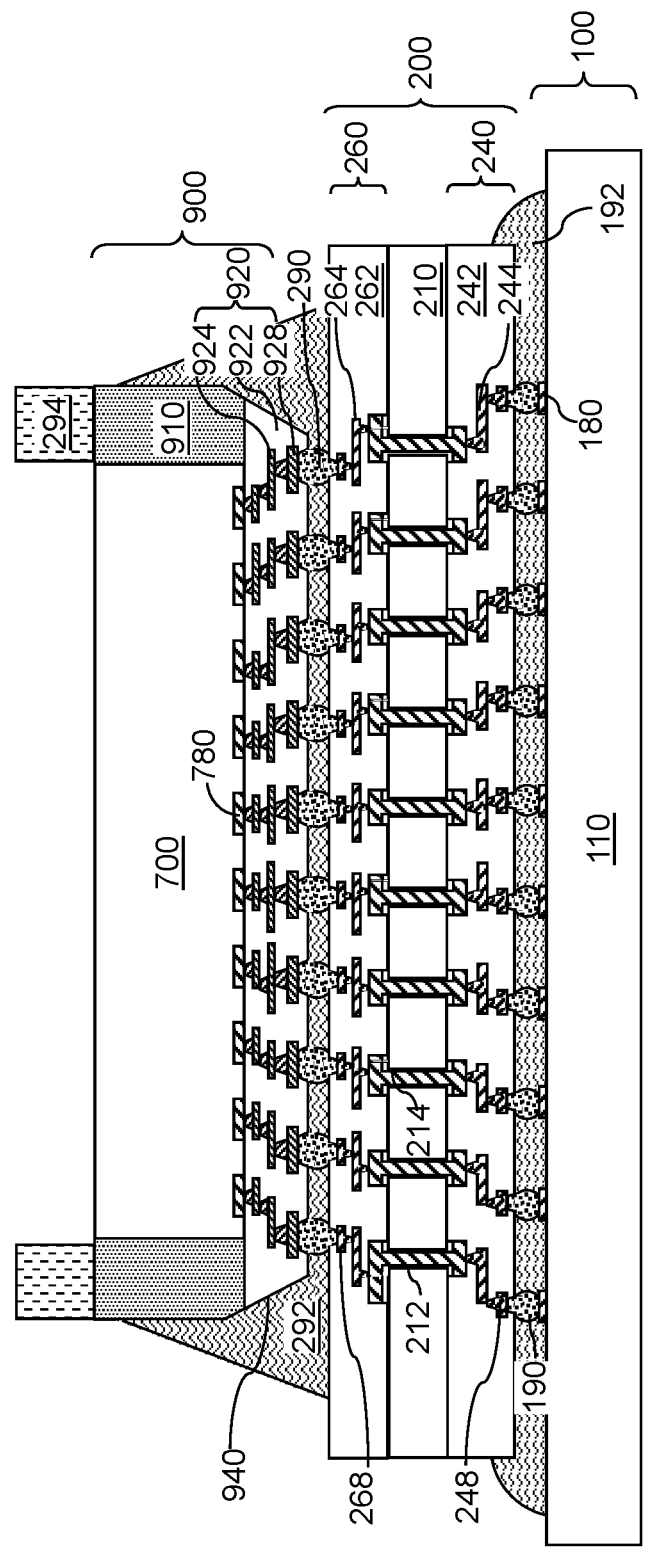
FIG. 13A is a vertical cross-sectional view of the first exemplary structure after the package substrate is attached to a printed circuit board (PCB) according to an embodiment of the present disclosure.
Figure 13B:
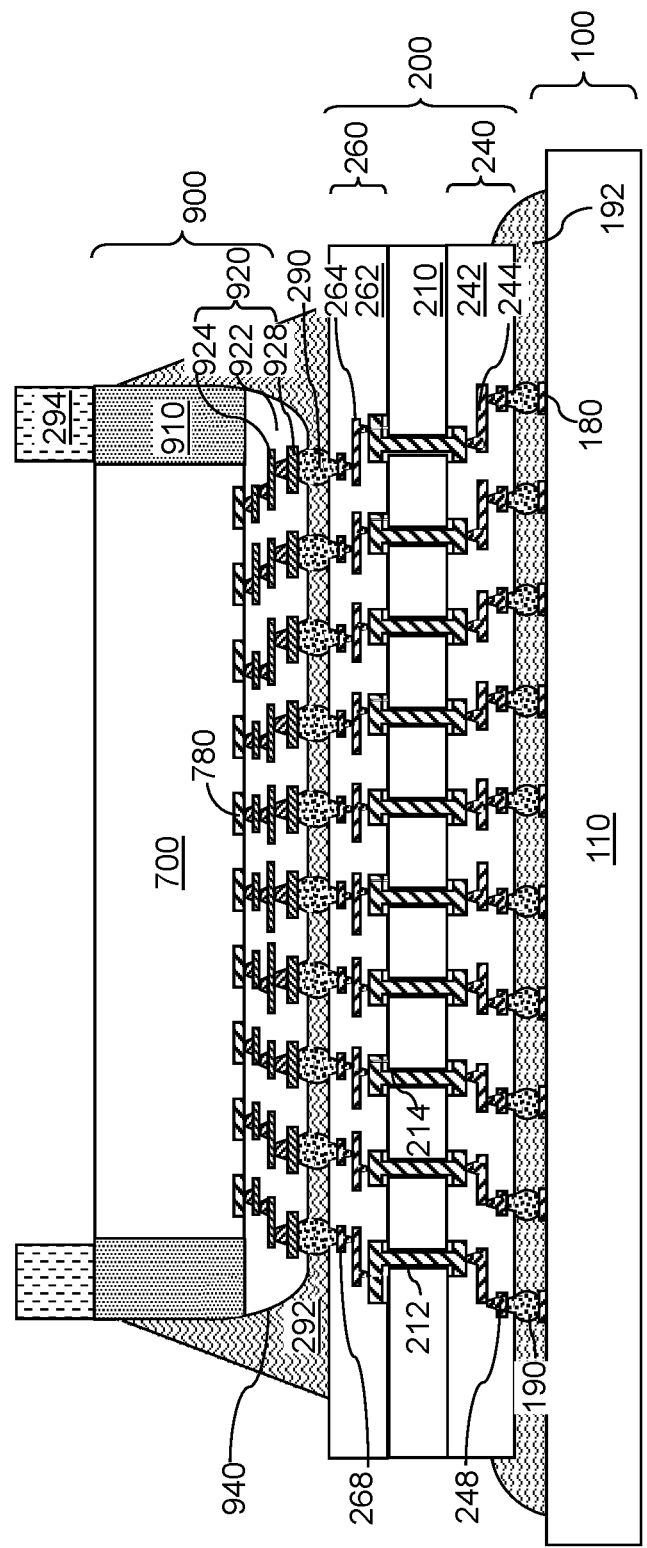
FIG. 13B is a vertical cross-sectional view of an alternative configuration of the first exemplary structure according to an embodiment of the present disclosure.

Referring to FIGS. 13A and 13B, a printed circuit board (PCB) 100 including a PCB substrate 110 and PCB bonding pads 180 may be provided. FIG. 13A illustrates a first configuration in which the angled surfaces 940 are planar surfaces, and FIG. 13B illustrates a second configuration in which the angled surfaces 940 are convex surfaces. The PCB 100 includes a printed circuitry (not shown) at least on one side of the PCB substrate 110. An array of solder joints 190 may be formed to bond the array of board-side bonding pads 248 to the array of PCB bonding pads 180. The solder joints 190 may be formed by disposing an array of solder balls between the array of board-side bonding pads 248 and the array of PCB bonding pads 180, and by reflowing the array of solder balls. An underfill material portion 192 may be formed around the solder joints 190 by applying and shaping an underfill material. The package substrate 200 is attached to the PCB 100 through the array of solder joints 190.

Optionally, a stabilization structure 294, such as a cap structure or a ring structure, may be attached to the assembly of the FOWLP 900 and the package substrate 200 to reduce deformation of the assembly during subsequent processing steps and/or during usage of the assembly.

Figure 13C:
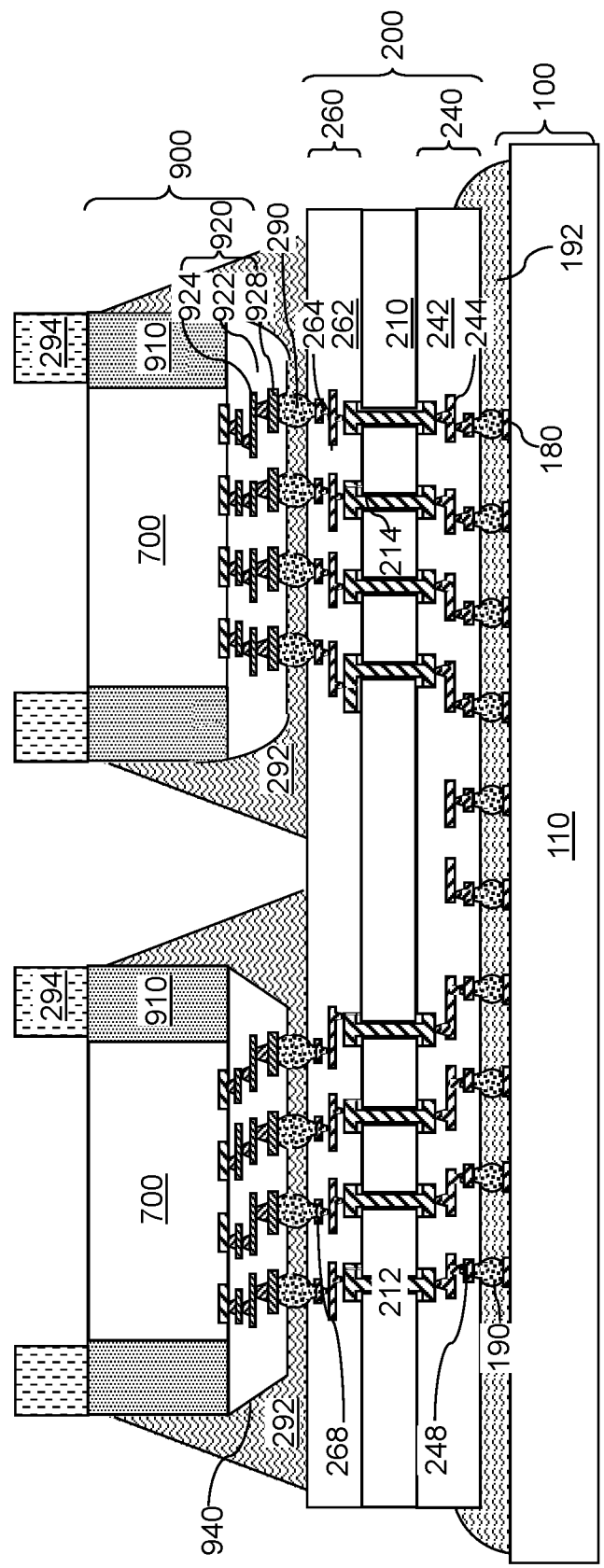
FIG. 13C is a vertical cross-sectional view of another alternative configuration of the first exemplary structure according to an embodiment of the present disclosure.

Referring to FIG. 13C, an alternative embodiment of the exemplary structure in which multiple semiconductor dies 700 are attached to a package substrate 290. Each semiconductor die 700 may have angled surfaces 940, which may be planar surfaces or convex surfaces. The angles surfaces 940 of the multiple semiconductor dies 700 may have identical bevel cuts, or may have different bevel cuts. For example, each of the multiple semiconductor dies 700 may have planar surfaces as the angled surfaces 940, convex surfaces as the angled surfaces, or a combination of planar surfaces and convex surfaces as the angled surfaces depending on the location, size, or orientation of each semiconductor die 700 relative to the package substrate 290. As illustrated in FIG. 13C, the semiconductor dies 700 have both an angled surface 940 and a convex surface.

Figure 14A:
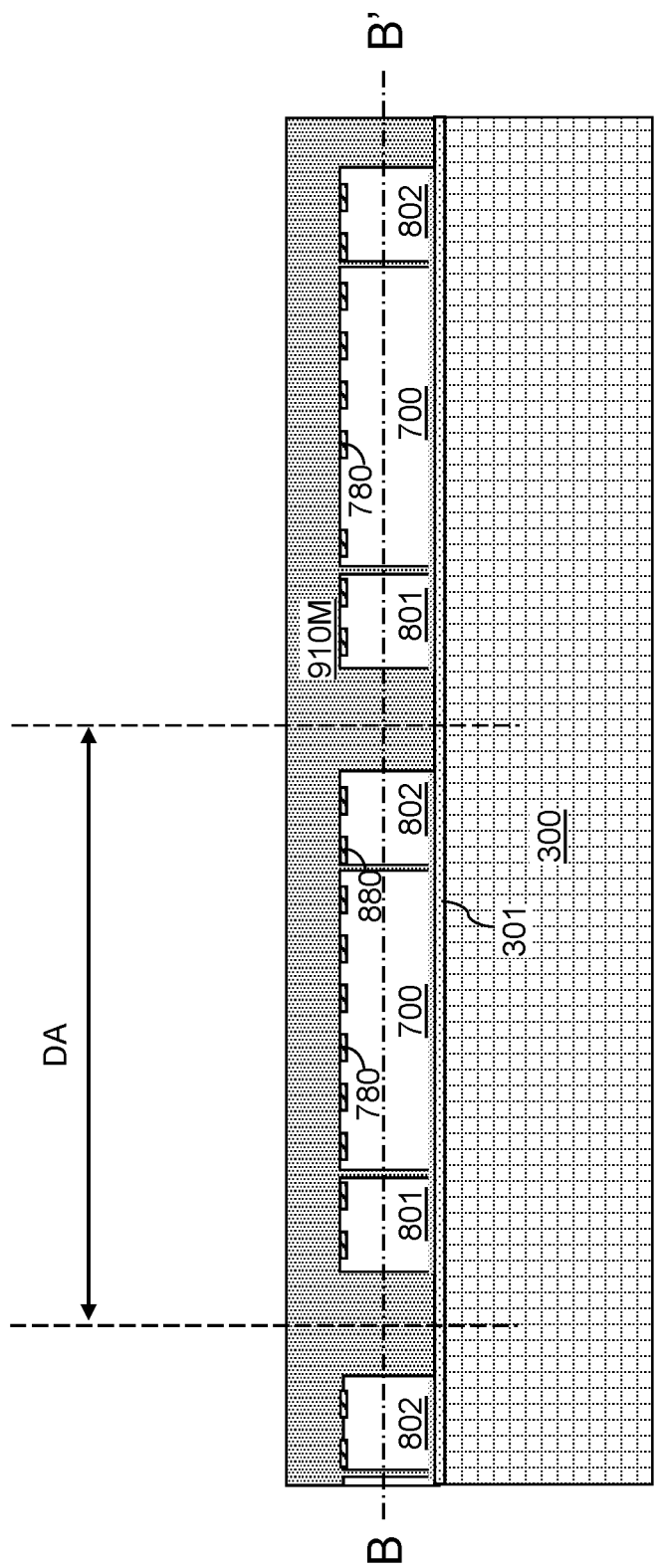
FIG. 14A is a vertical cross-sectional view of a region of a reconstituted wafer on a carrier substrate in which each reconstituted die includes a plurality of semiconductor dies according to an embodiment of the present disclosure.
Figure 14B:
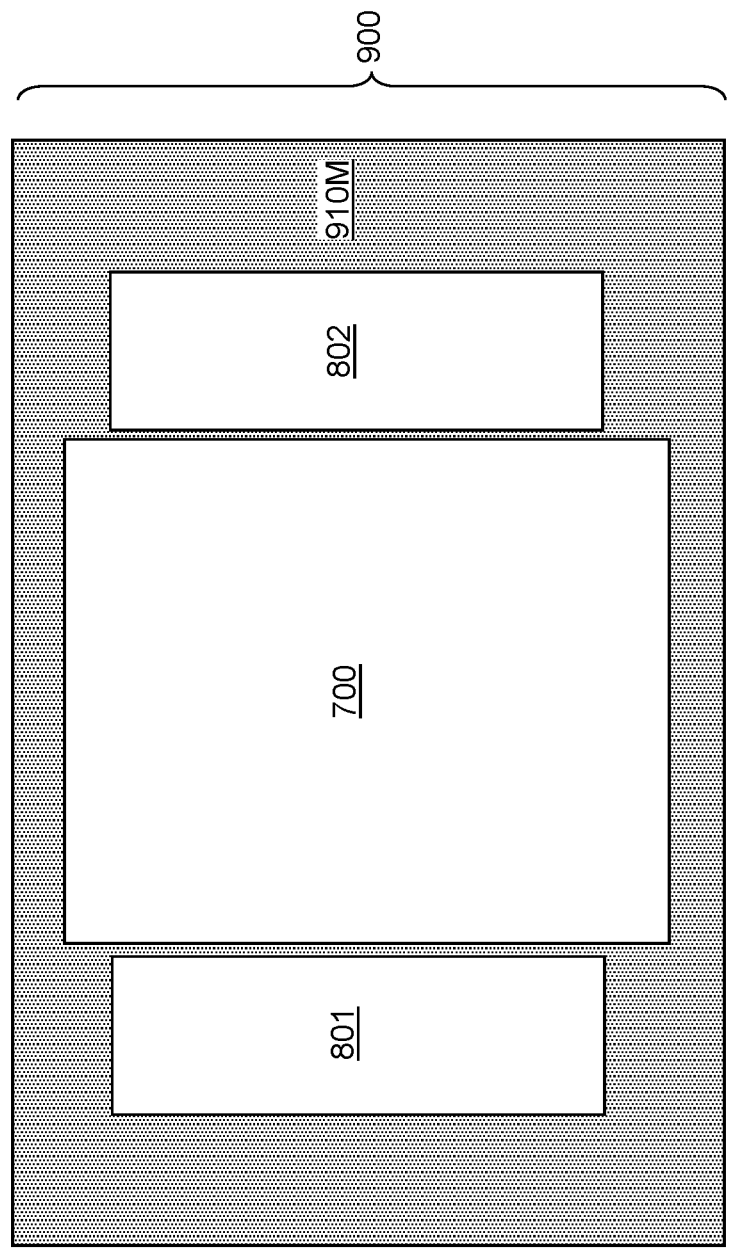
FIG. 14B is a horizontal cross-sectional view of the region of the reconstituted wafer along the horizontal plane B-B' of FIG. 14A.

Referring to FIGS. 14A and 14B, another exemplary structure according to an embodiment of the present disclosure is illustrated, which may be derived from the exemplary structure of FIG. 2 by placing a plurality of semiconductor dies (700, 801, 802) in lieu of a single semiconductor die 700 within each die area DA. The plurality of semiconductor dies (700, 801, 802) may include at least one system-on-chip (SoC) die. The plurality of semiconductor dies (700, 801, 802) may include a first semiconductor die 700 and at least one second semiconductor die (801, 802). In an illustrative example, the first semiconductor die 700 may include and SoC die, and the at least one second semiconductor die (801, 802) may include a memory die. Alternatively, the first semiconductor die 700 may include a central processing unit die, and the at least one second semiconductor die (801, 802) may include a graphic processing unit die. The plurality of semiconductor dies (700, 801, 802) may be embedded in the EMC matrix 910M such that the top surfaces of the plurality of semiconductor dies (700, 801, 802) are positioned within a same horizontal plane. Subsequently, the processing steps of FIGS. 3-7C or FIGS. 3, 4, and 8A-10C may be performed to provide an FOWLP 900 including angled surfaces 940 in corner regions.

Figure 15A:
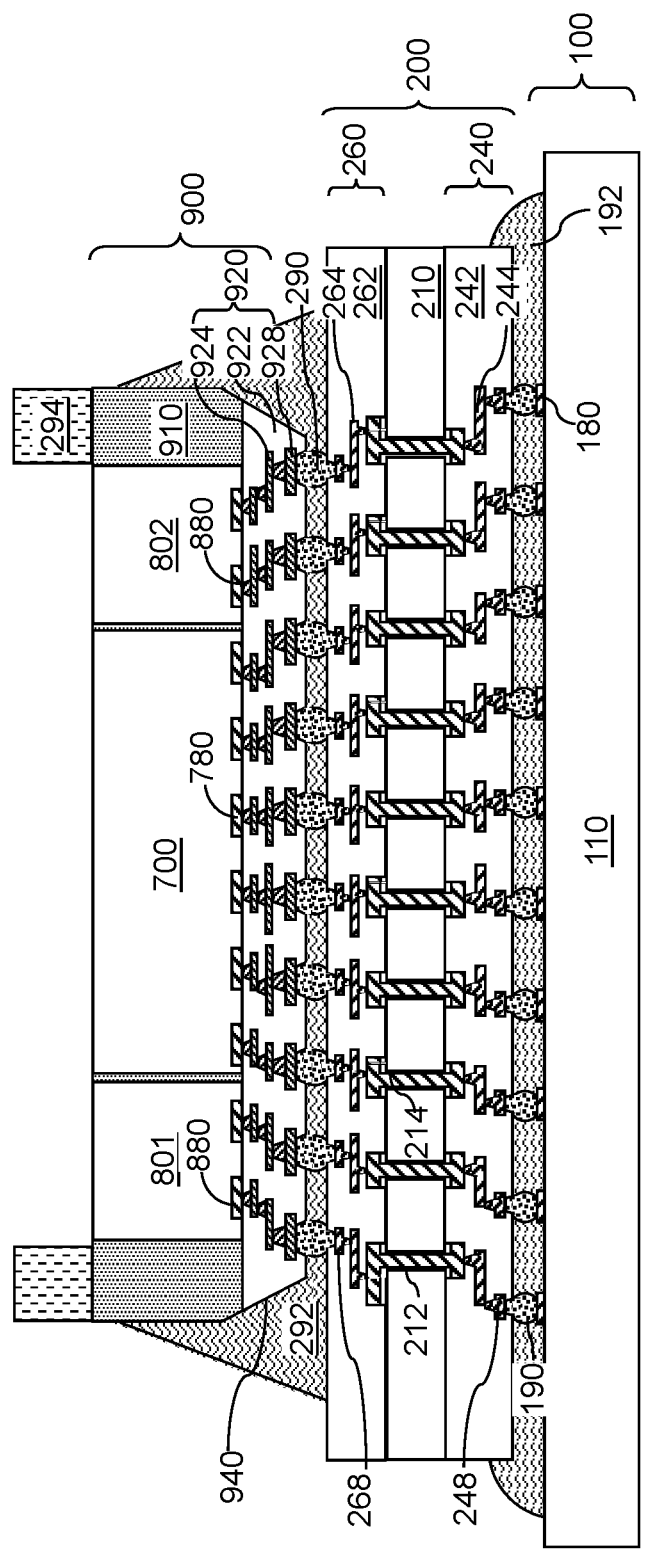
FIG. 15A is a vertical cross-sectional view of a second exemplary structure after chamfer regions are formed on a fan-out wafer-level package, and the fan-out wafer-level package is attached to a package substrate, and after the package substrate is attached to a printed circuit board (PCB) according to an embodiment of the present disclosure.
Figure 15B:
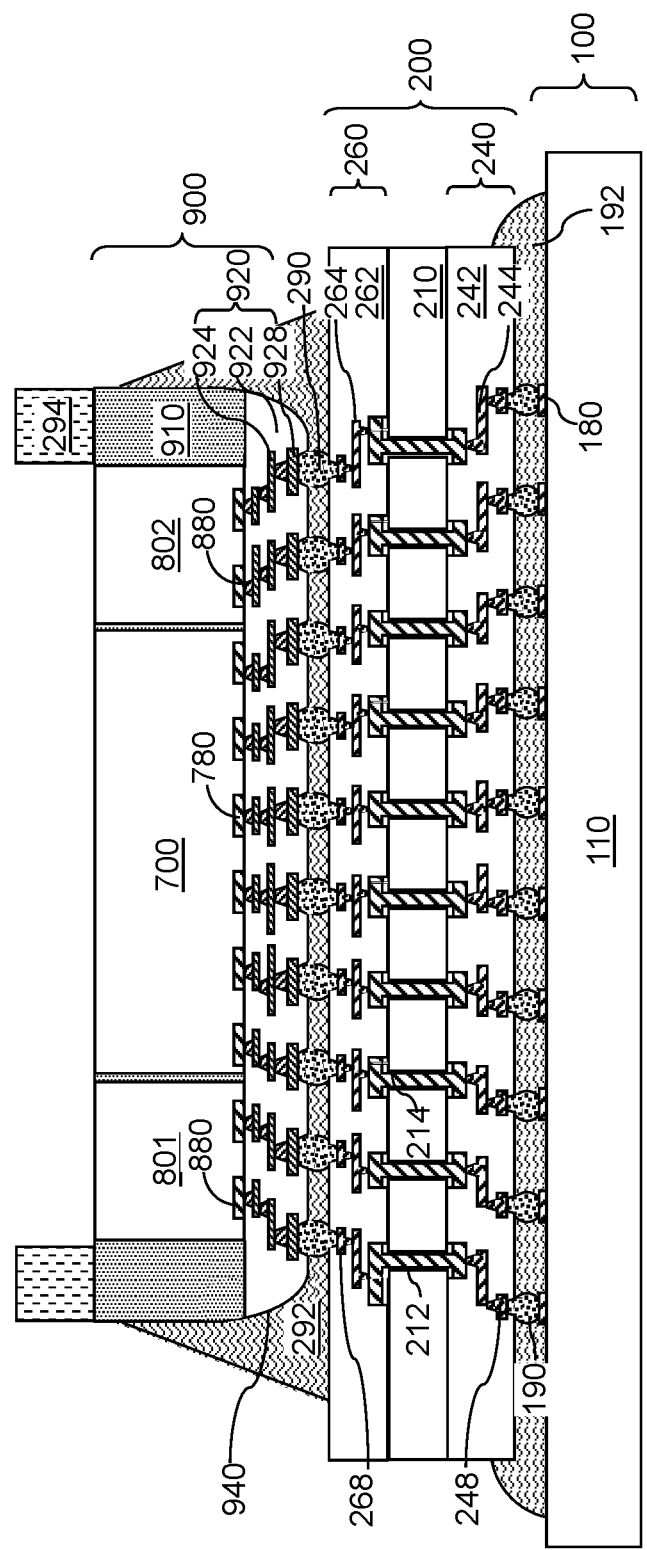
FIG. 15B is a vertical cross-sectional view of an alternative configuration of the second exemplary structure according to an embodiment of the present disclosure.

Referring to FIGS. 15A and 15B, the processing steps of FIGS. 11 and 12 may be performed, followed by the processing steps of FIG. 13A or FIG. 13B. FIG. 15A illustrates a first configuration in which the angled surfaces

940 are planar surfaces, and FIG. 15B illustrates a second configuration in which the angled surfaces 940 are convex surfaces.

In an additional alternative embodiment, high bandwidth memory (HBM) dies may be used among a plurality of semiconductor dies within a FOWLP 900.

Figure 16A:
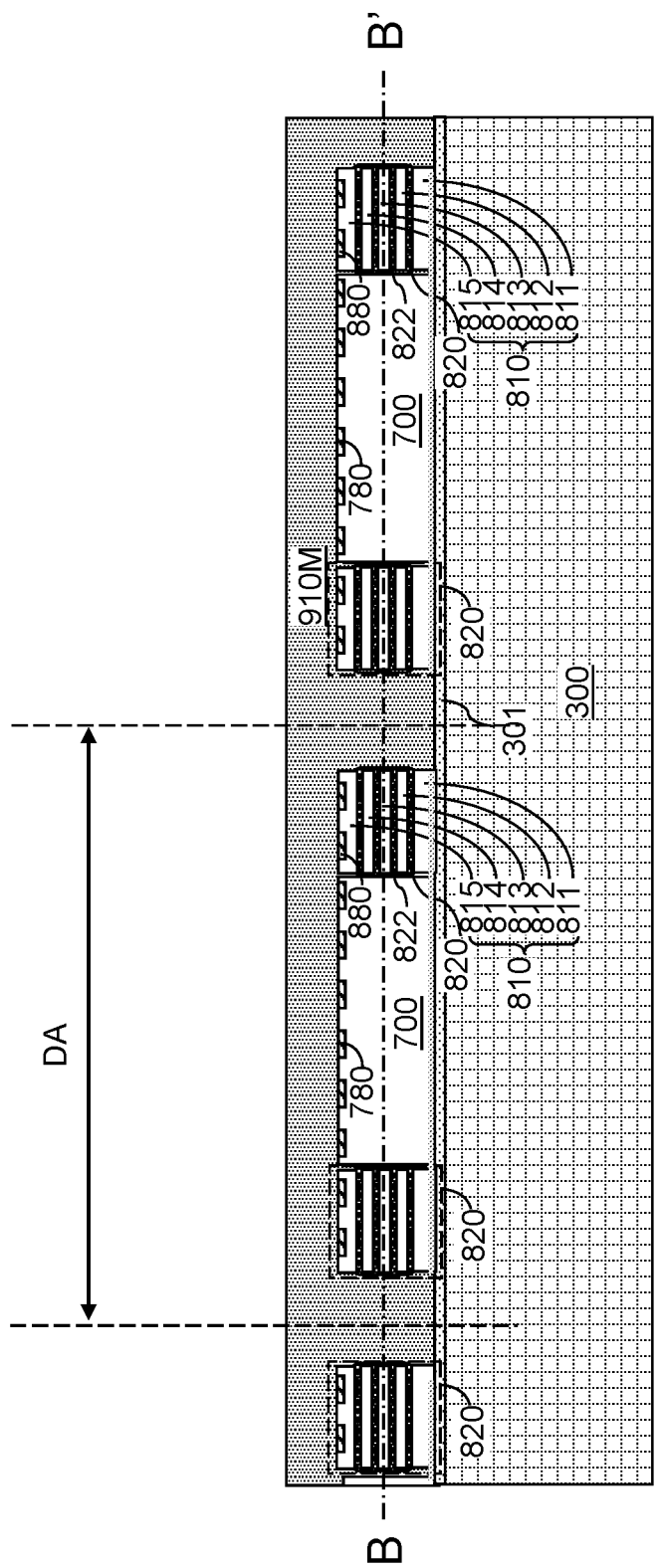
FIG. 16A is a vertical cross-sectional view of a region of a reconstituted wafer on a carrier substrate in which each reconstituted die includes a system-on-chip (SoC) die and high bandwidth memory (HBM) dies according to an embodiment of the present disclosure.
Figure 16B:
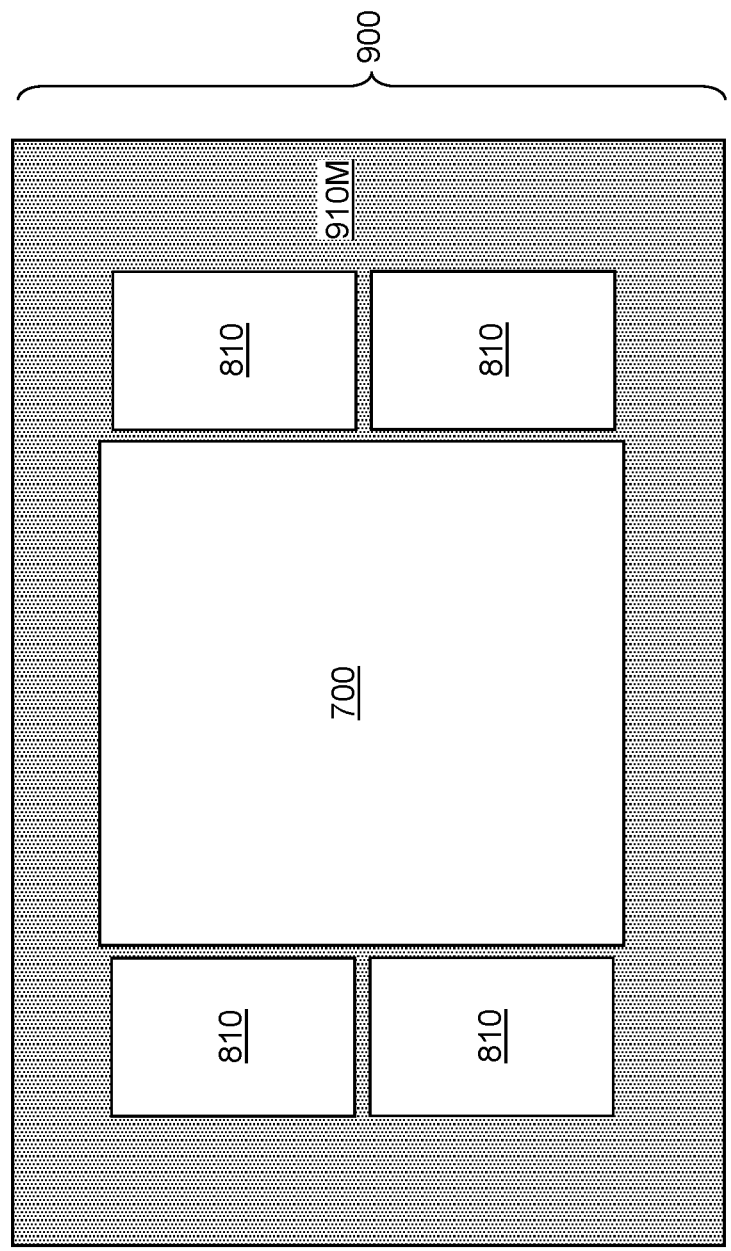
FIG. 16B is a horizontal cross-sectional view of the region of the reconstituted wafer along the horizontal plane B-B' of FIG. 14A.

Referring to FIGS. 16A and 16B, an additional exemplary structure according to an embodiment of the present disclosure is illustrated, which may be derived from the exemplary structure of FIG. 2 by placing a plurality of semiconductor dies (700, 810) including at least one HBM die 810 in lieu of a single semiconductor die 700 within each die area DA. The plurality of semiconductor dies (700, 810) may include at least one system-on-chip (SoC) die. For example, the plurality of semiconductor dies (700, 810) may include a first semiconductor die 700 and at least one second semiconductor die that is an HBM die 810. An HBM die includes a vertical stack of static random access memory dies and provides high bandwidth as defined under JEDEC standards, i.e., standards defined by The JEDEC Solid State Technology Association.

Figure 16C:
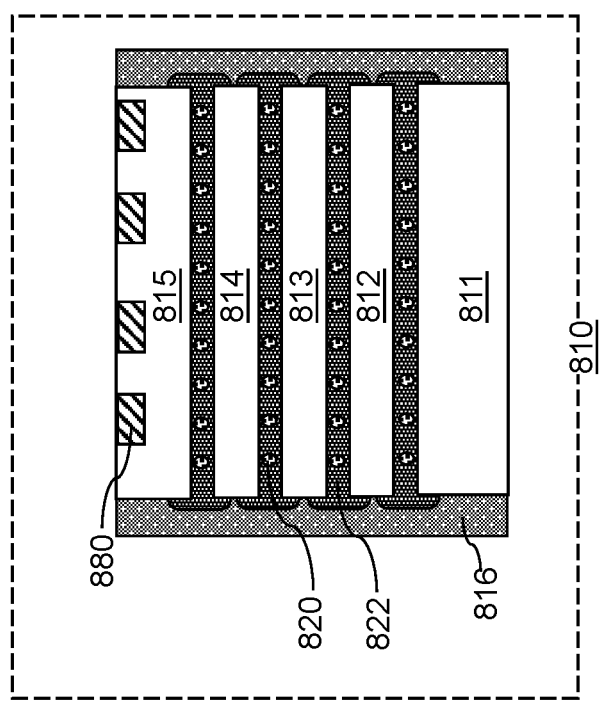
FIG. 16C is a magnified vertical cross-sectional view of a high bandwidth memory die of FIGS. 16A and 16B.

In an example illustrated in FIG. 16C, an HBM die 810 may include a vertical stack of static random access memory (SRAM) dies (811, 812, 813, 814, 815) that are interconnected to one another through arrays of microbumps 820. One of the SRAM dies, such as a bottommost SRAM die 811 or a topmost SRAM die 815, may include a logic circuit for providing controlling each of the SRAM dies (811, 812, 813, 814, 815), and the topmost SRAM die 815 may include an array of bonding pads 880. An HBM underfill material portion 822 may fill the gaps between neighboring pairs of the SRAM dies (811, 812, 813, 814, 815). Optionally, an epoxy molding material enclosure frame 816 may be used to laterally surround, and to provide structural stability to, the vertical stack of the SRAM dies (811, 812, 813, 814, 815). In one embodiment, the first semiconductor die 700 may include and SoC die, and each HBM die 810 may be configured to communicate with the SoC die.

The plurality of semiconductor dies (700, 801, 802) may be embedded in the EMC matrix 910M such that the top surfaces of the plurality of semiconductor dies (700, 801, 802) are positioned within a same horizontal plane. Subsequently, the processing steps of FIGS. 3-7C or FIGS. 3, 4, and 8A-10C may be performed to provide an FOWLP 900 including angled surfaces 940 in corner regions. The redistribution structure 920 within each FOWLP 900 may be configured to provide chip-to-chip communication paths between the first semiconductor die 700 and the HBM die(s) 810.

Figure 17A:
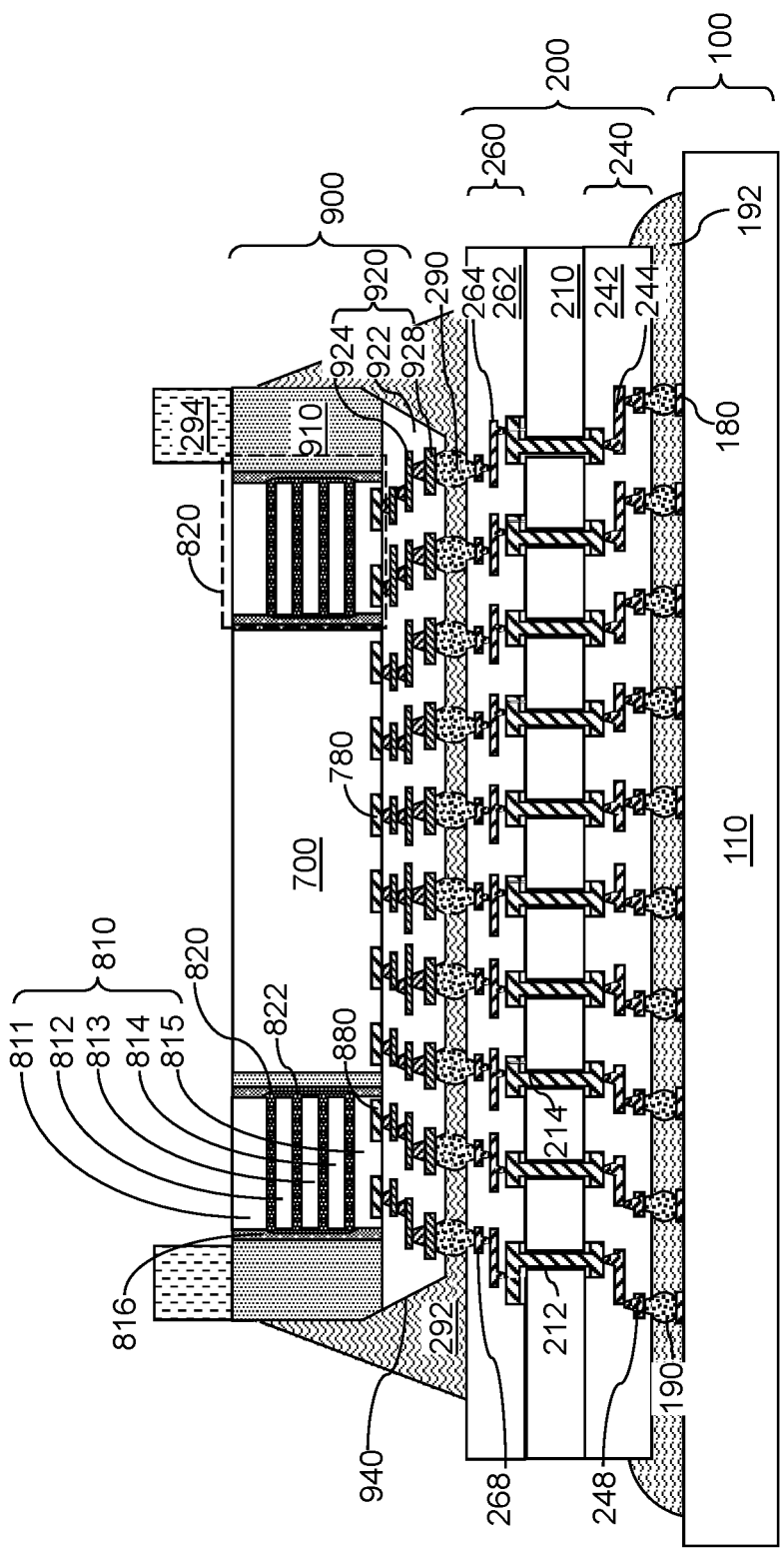
FIG. 17A is a vertical cross-sectional view of a third exemplary structure after chamfer regions are formed on a fan-out wafer-level package, and the fan-out wafer-level package is attached to a package substrate, and after the package substrate is attached to a printed circuit board (PCB) according to an embodiment of the present disclosure.
Figure 17B:
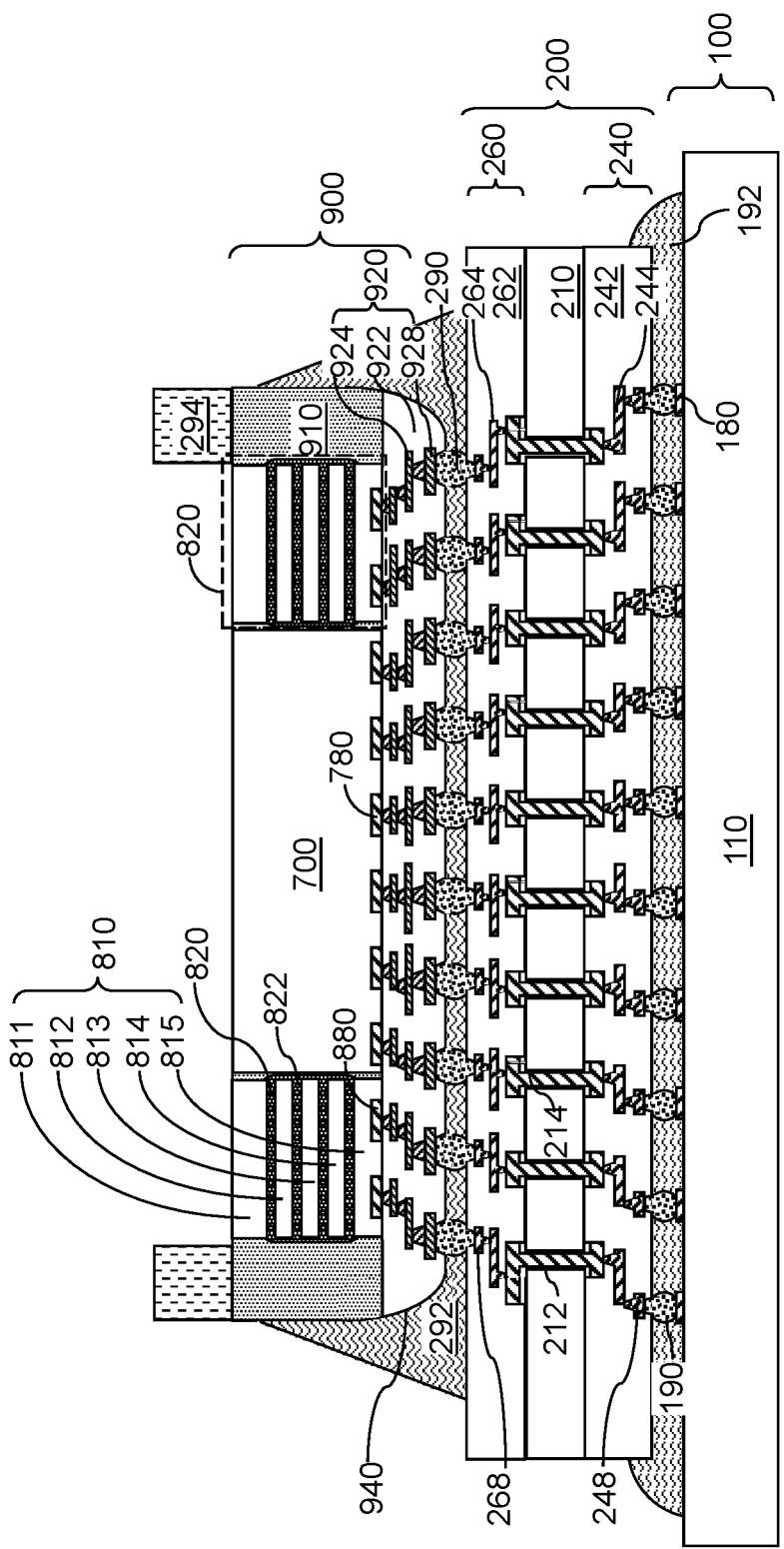
FIG. 17B is a vertical cross-sectional view of an alternative configuration of the third exemplary structure according to an embodiment of the present disclosure.

Referring to FIGS. 17A and 17B, the processing steps of FIGS. 11 and 12 may be performed, followed by the processing steps of FIG. 13A or FIG. 13B. FIG. 17A illustrates a first configuration in which the angled surfaces 940 are planar surfaces, and FIG. 17B illustrates a second configuration in which the angled surfaces 940 are convex surfaces.

Figure 18:
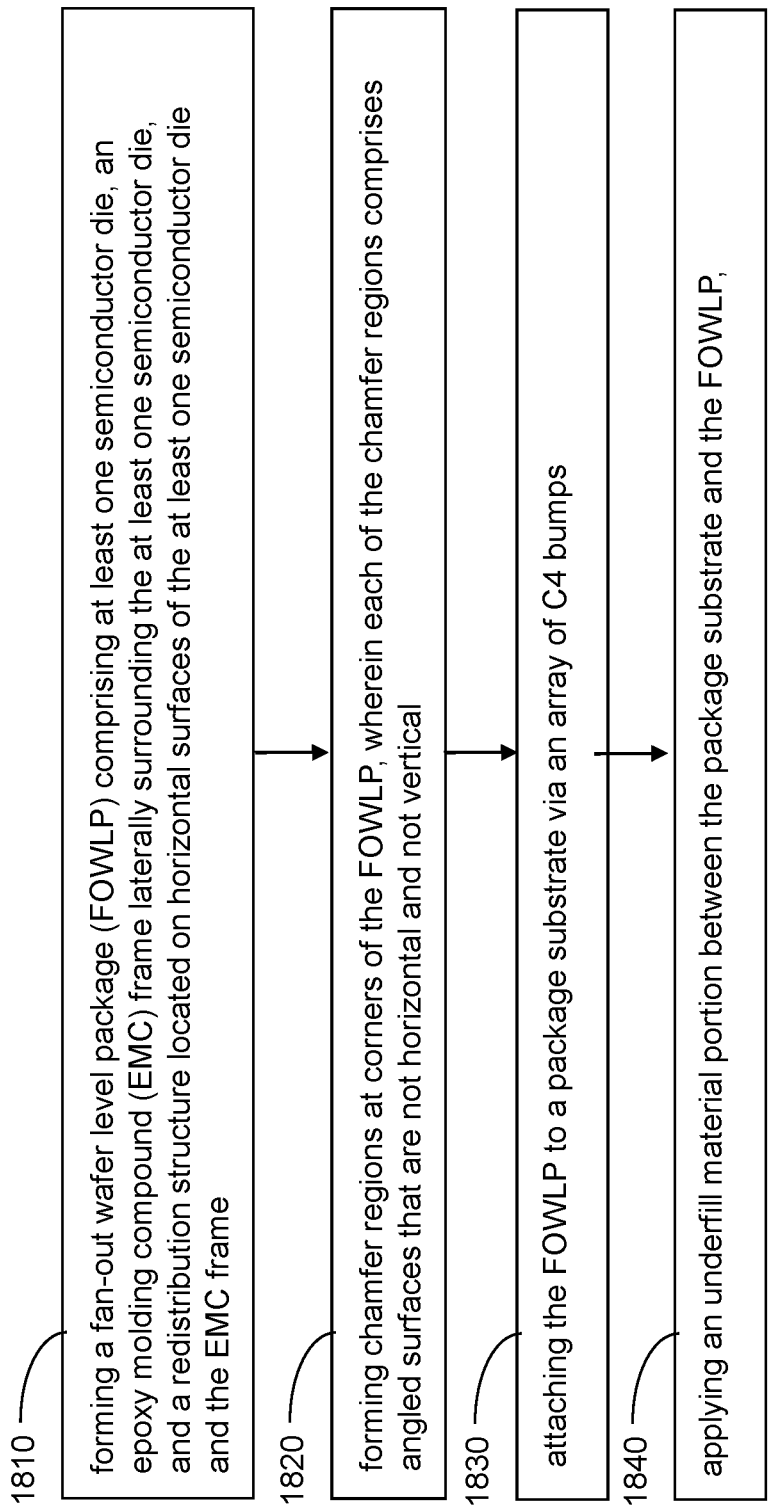
FIG. 18 is a flowchart illustrating steps for forming the exemplary structure according to an embodiment of the present disclosure.

Referring to FIG. 18, general processing steps for forming a chip package structure is illustrated according to an embodiment of the present disclosure. Referring to step 1810, a fan-out wafer level package (FOWLP) 900 comprising at least one semiconductor die (700, 801, 802, 810), an epoxy molding compound (EMC) die frame 910 laterally surrounding the at least one semiconductor die (700, 801, 802, 810), and a redistribution structure 920 located on horizontal surfaces of the at least one semiconductor die (700, 801, 802, 810) and the EMC die frame 910 is provided. Referring to step 1820, chamfer regions are formed at corners of the FOWLP 900. The chamfer regions may be formed while the FOWLP 900 is embedded within a reconstituted wafer 900W prior to dicing, and/or may be formed after the reconstituted wafer 900W is diced into multiple FOWLPs 900. The chamfer regions comprise angled surfaces 940 that are not horizontal and not vertical. Referring to step 1830, the FOWLP 900 may be attached to a package substrate 200 via an array of solder material portions 290. Referring to step 1840, an underfill material portion 292 may be applied between the package substrate 200 and the FOWLP 900. The underfill material portion 292 laterally surrounds and contacts the angled surfaces 940.

Referring to all drawings and according to various embodiments of the present disclosure, a chip package structure is provided, which comprises: a fan-out wafer level package (FOWLP) 900 comprising at least one semiconductor die (700, 801, 802, 810), an epoxy molding compound (EMC) die frame 910 laterally surrounding the at least one semiconductor die (700, 801, 802, 810), and a redistribution structure 920 located on horizontal surfaces of the at least one semiconductor die (700, 801, 802, 810) and the EMC die frame 910, wherein the FOWLP 900 has chamfer regions at which horizontal surfaces and vertical surfaces of the FOWLP are connected via angled surfaces 940 that are not horizontal and not vertical; a package substrate 200 that is attached to the FOWLP 900 via an array of solder material portions 290; and an underfill material portion 292 that laterally surrounds the array of solder material portions 290 and contacts an entirety of the angled surfaces 940.

In one embodiment, the FOWLP 900 comprises four chamfer regions located at four corners of a proximal horizontal surface of the FOWLP that faces the package substrate 200, and an entirety of each of the angled surfaces 940 contacts the underfill material portion 292.

In one embodiment, edges of the angled surfaces 940 are adjoined to vertical sidewalls of the EMC die frame 910, vertical sidewalls of the redistribution structure 920, and a horizontal surface of the redistribution structure 920 that contacts the underfill material portion 292.

In one embodiment, each of the angled surfaces 940 comprises an angled redistribution structure surface segment including a respective surface of redistribution dielectric layers 922 within the redistribution structure 920, and an angled EMC die frame surface segment including a respective surface of the EMC die frame 910.

In one embodiment, each of the angled surfaces 940 comprises a respective planar beveled surface contained entirely within a respective two-dimensional Euclidean plane. In one embodiment, each of the planar beveled surfaces is at an angle in a range from 20 degrees to 80 degrees with respective to a vertical direction.

In one embodiment, each of the angled surfaces comprises a respective convex surface having a variable taper angle with respective to a vertical direction that decreases with a vertical distance from a horizontal plane including a horizontal interface between the FOWLP 900 and the underfill material portion 292.

In one embodiment, the at least one semiconductor die (700, 801, 802, 810) comprises a plurality of semiconductor dies that includes at least one system-on-chip (SoC) die. In one embodiment, the at least one semiconductor die comprises a high bandwidth memory (HBM) die 810 including a vertical stack of static random access memory (SRAM) dies (811, 812, 813, 814, 815) that are interconnected to one another through microbumps and are laterally surrounded by an epoxy molding material enclosure frame 816.

In one embodiment, a horizontal surface of the at least one semiconductor die (811, 812, 813, 814, 815) is located within a same horizontal plane as a distal horizontal surface of the EMC die frame 910 that is not in contact with the underfill material portion.

In one embodiment, the redistribution structure 920 comprises redistribution dielectric layers 922, wherein each of the redistribution dielectric layers 922 comprises a respective surface segment of each of the angled surfaces 940; redistribution wiring interconnects 924 embedded in the redistribution dielectric layers 922; and fan-out bonding pads 928 that are bonded to the array of solder material portions 290, wherein the redistribution wiring interconnects 924 laterally extend over, and across, a boundary between the at least one semiconductor die (700, 801, 802, 810) and the EMC die frame 910.

In one embodiment, the package substrate 200 comprises: a chip-side surface laminar circuit 260 comprising chip-side wiring interconnects 264 connected to an array of chip-side bonding pads 268 that is bonded to the array of solder material portions 290; and a board-side surface laminar circuit 240 including board-side wiring interconnects 244 connected to an array of board-side bonding pads 248.

According to various embodiments of the present disclosure, a structure comprising a fan-out wafer level package (FOWLP) 900 is provided. The FOWLP 900 comprises at least one semiconductor die (700, 801, 802, 810); an epoxy molding compound (EMC) die frame 910 laterally surrounding the at least one semiconductor die (700, 801, 802, 810); and a redistribution structure 920 located on horizontal surfaces of the at least one semiconductor die (700, 801, 802, 810) and the EMC die frame 910, wherein the FOWLP 900 has chamfer regions including angled surfaces 940 that are not horizontal and not vertical, and each of the angled surfaces 940 comprises a surface segment of the redistribution structure 920 and a surface segment of the EMC die frame 910. In one embodiment, each of the angled surfaces 940 comprises a respective planar beveled surface contained entirely within a respective two-dimensional Euclidean plane.

The various structures and methods of the present disclosure may be used to provide a chip package structure including a fan-out wafer level package (FOWLP) 900 having a shape that avoids formation of a stress concentration points from which cracks in an underfill material may initiate under mechanical stress during handling of the chip package structure or during use of a device including the chip package structure. The angled surfaces 940 in the chamfer regions redistribute mechanical stress at corners of the FOWLP 900 over a wider area, and suppresses formation and/or magnification of a crack in the underfill material portion 292, thereby increasing the reliability of the chip package structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a chip package structure, comprising:
   forming a two-dimensional array of semiconductor dies over a carrier substrate;
   forming an epoxy molding compound (EMC) matrix around the two-dimensional array of semiconductor dies;
   forming a redistribution structure layer including fan-out bonding pads over the EMC matrix and the two-dimensional array of semiconductor dies;
   attaching solder material portions to the fan-out bonding pads;
   detaching the carrier substrate from an assembly of the two-dimensional array of semiconductor dies and the EMC matrix; and
   dicing portions of the assembly, wherein one of the diced portions of the assembly comprises a fan-out package that comprises at least one semiconductor die which is a subset of the semiconductor dies, an epoxy molding compound (EMC) die frame comprising a patterned portion of the EMC matrix and laterally surrounding the at least one semiconductor die, and a redistribution structure comprising a patterned portion of the redistribution structure layer and located on horizontal surfaces of the at least one semiconductor die and the EMC die frame;
   removing corner portions of the redistribution structure and the EMC die frame after dicing the assembly, wherein the fan-out package comprises chamfer regions comprising angled surfaces which include surface segments of the EMC die frame that are not horizontal and not vertical upon formation of the chamfer regions;
   attaching the fan-out package to a package substrate via an array of solder material portions; and
   applying an underfill material portion between the package substrate and the fan-out package, wherein the underfill material portion laterally surrounds and contacts the angled surfaces.

2. The method of claim 1, wherein removal of the corner portions of the redistribution structure and the EMC die frame is performed by a bevel cut process that forms the angled surfaces as planar beveled surfaces or by a grinding process that forms the angled surfaces as convex surfaces.

3. The method of claim 1, wherein the angled surfaces are formed by chamfering corner portions of the redistribution structure within the fan-out package after dicing the reconstituted wafer.

4. The method of claim 1, wherein:
   a first horizontal surface of the redistribution structure of the fan-out package is formed over the at least one semiconductor die and a second horizontal surface of the redistribution structure of the fan-out package is formed directly on each of the at least one semiconductor die;
   formation of the chamfer regions comprises formation of angled surfaces which include surface segments of the EMC die frame that are not horizontal and not vertical such that the first horizontal surface of the redistribution structure and vertical surfaces of the EMC die frame are connected via the angled surfaces; and
   said formation of the chamfer regions reduces a lateral extent of the first horizontal surface such that the first horizontal surface has a lesser lateral extent than the second horizontal surface and is adjoined to the angled surfaces of the chamfer regions after formation of the chamfer regions.

5. The method of claim 1, further comprising chamfering corner portions of the EMC die frame and the redistribution structure such that a combination of a surface segment of the EMC die frame and a surface segment of the redistribution structure is formed as one of the angled surfaces.

6. A method of forming a chip package structure, the method comprising:
forming a reconstituted wafer comprising a two-dimensional array of redistribution structures, a two-dimensional array of semiconductor dies, and a molding compound matrix;
forming a two-dimensional array of chamfer regions in the reconstituted wafer, wherein each of the chamfer regions comprises a respective set of angled surfaces; and
dicing the reconstituted wafer after formation of the two-dimensional array of chamfer regions in the reconstituted wafer, wherein a fan-out package comprising a diced portion of the reconstituted wafer is formed, wherein the fan-out package comprises at least one semiconductor die which is a subset of the semiconductor dies, an epoxy molding compound (EMC) die frame comprising a patterned portion of the EMC matrix and laterally surrounding the at least one semiconductor die, and a redistribution structure located on horizontal surfaces of the at least one semiconductor die and the EMC die frame, wherein a first horizontal surface of the redistribution structure and vertical surfaces of the EMC die frame are connected via angled surfaces which include surface segments of the EMC die frame that are not horizontal and not vertical; and
attaching the fan-out package to a package substrate employing an array of solder material portions.

7. The method of claim 6, further comprising forming an array of recess cavities having tapered surfaces in the redistribution structure layer prior to dicing the assembly, wherein the angled surfaces comprise a subset of the tapered surfaces that are provided on the fan-out package.

8. The method of claim 6, wherein dicing channels employed during dicing of the reconstituted wafer extend through a respective subset of the two-dimensional array of chamfer regions.

9. The method of claim 6, wherein forming the two-dimensional array of chamfer regions comprises forming a two dimensional array of discrete recess cavities that are not connected among one another.

10. The method of claim 9, wherein forming the two dimensional array of discrete recess cavities comprises forming a two-dimensional array of diamond-shaped openings at corners of die areas within the reconstituted wafer.

11. The method of claim 6, further comprising chamfering corner portions of the EMC die frame and the redistribution structure such that a combination of a surface segment of the EMC die frame and a surface segment of the redistribution structure is formed as one of the angled surfaces.

12. The method of claim 6, further comprising forming a convex surface having a variable taper angle with respect to a vertical direction that decreases with a vertical distance from a horizontal plane including a horizontal interface between the fan-out package and a underfill material portion as one of the angled surfaces by chamfering corner portions of the EMC die frame and the redistribution structure.

13. The method of claim 6, wherein:
a first horizontal surface of the redistribution structure of the fan-out package is formed over the at least one semiconductor die and a second horizontal surface of the redistribution structure of the fan-out package is formed directly on each of the at least one semiconductor die;
formation of the chamfer regions comprises formation of angled surfaces which include surface segments of the EMC die frame that are not horizontal and not vertical such that the first horizontal surface of the redistribution structure and vertical surfaces of the EMC die frame are connected via the angled surfaces; and
said formation of the chamfer regions reduces a lateral extent of the first horizontal surface such that the first horizontal surface has a lesser lateral extent than the second horizontal surface and is adjoined to the angled surfaces of the chamfer regions after formation of the chamfer regions.

14. A method of forming a chip package structure, the method comprising:
forming a reconstituted wafer comprising a two-dimensional array of redistribution structures, a two-dimensional array of semiconductor dies, and a molding compound matrix;
forming a two-dimensional array of chamfer regions in the reconstituted wafer, wherein each of the chamfer regions comprises a respective set of angled surfaces; and
dicing the reconstituted wafer after formation of the two-dimensional array of chamfer regions in the reconstituted wafer, wherein a fan-out package comprising a diced portion of the reconstituted wafer is formed, wherein the fan-out package comprises at least one semiconductor die, an epoxy molding compound (EMC) die frame laterally surrounding the at least one semiconductor die, and a redistribution structure located on the at least one semiconductor die and the EMC die frame, wherein the redistribution structure comprises a first horizontal surface that is not in contact with the at least one semiconductor die and a second horizontal surface that is in direct contact with each of the at least one semiconductor die and is located on an opposite side of the first horizontal surface, wherein the first horizontal surface of the redistribution structure and vertical surfaces of the EMC die frame are connected via angled surfaces which include surface segments of the EMC die frame that are not horizontal and not vertical and further include surface segments of the redistribution structure that are not horizontal and not vertical;
attaching the fan-out package to a package substrate employing an array of solder material portions; and
applying an underfill material portion between the package substrate and the fan-out package, wherein the underfill material portion laterally surrounds and contacts an entirety of the angled surfaces.

15. The method of claim 14, further comprising etching or chamfering a corner portion of the EMC die frame and a corner portion of the redistribution structure such that at least one of the angled surfaces is formed as a planar beveled surface.

16. The method of claim 14, further comprising chamfering a corner portion of the EMC die frame and a corner portion of the redistribution structure such that at least one of the angled surfaces is formed as a convex surface.

17. The method of claim 14, further comprising performing a chamfering process or an etching process that simultaneously removes a corner portion of the EMC die frame and a corner portion of the redistribution structure, wherein the chamfering process or the etching process forms one of the angled surfaces as a combination of a surface segment of the redistribution structure and a surface segment of the EMC die frame.

18. The method of claim 14, further comprising performing a chamfering process or an etching process that simultaneously removes a corner portion of the EMC die frame and a corner portion of the redistribution structure, wherein the chamfering process or the etching process forms the angles surfaces such that edges of the angled surfaces are adjoined to vertical sidewalls of the EMC die frame, vertical sidewalls of the redistribution structure, and the second horizontal surface of the redistribution structure.

19. The method of claim 14, wherein dicing channels employed during dicing of the reconstituted wafer extend through a respective subset of the two-dimensional array of chamfer regions.

20. The method of claim 14, wherein forming the two-dimensional array of chamfer regions comprises forming a two dimensional array of discrete recess cavities that are not connected among one another.

* * * * *